United States Patent
Feldmeier et al.

(10) Patent No.: US 7,139,867 B2
(45) Date of Patent: *Nov. 21, 2006

(54) PARTIALLY-ORDERED CAMS USED IN TERNARY HIERARCHICAL ADDRESS SEARCHING/SORTING

(75) Inventors: David Feldmeier, Morristown, NJ (US); Tyler Arnold, Long Valley, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/645,604

(22) Filed: Aug. 22, 2003

(65) Prior Publication Data

US 2004/0039845 A1 Feb. 26, 2004

Related U.S. Application Data

(63) Continuation of application No. 09/929,309, filed on Aug. 14, 2001, now abandoned, which is a continuation of application No. 09/168,445, filed on Oct. 8, 1998, now Pat. No. 6,289,414.

(51) Int. Cl.
G06F 12/00 (2006.01)
G06F 13/00 (2006.01)

(52) U.S. Cl. .................. 711/108; 711/117; 711/202; 711/219

(58) Field of Classification Search ................. 711/108, 711/117, 202, 219, 100, 154; 710/65; 712/224
See application file for complete search history.

(56) References Cited

U.S. PATENT DOCUMENTS 5,251,169 A 10/1993 Josephson
5,319,590 A 6/1994 Montoye
5,386,413 A 1/1995 McAuley et al.
5,841,874 A 11/1998 Kempke et al.
5,920,886 A 7/1999 Feldmeier
5,930,359 A 7/1999 Kempke et al.
6,289,414 B1 9/2001 Feldmeier et al.

FOREIGN PATENT DOCUMENTS

WO    WO 98/0716    2/1998

OTHER PUBLICATIONS

A Method for Fast IPv4 and IPv4 CIDR Address Translation and Filtering Using the Music Wideprt LANCAM, and LANCAM 1 Family,p Music Semiconductors, Application Note AN-N22, Jan. 14, 1998, pp. 1-16.*
McAuley et al., "Fast Routing Table Lookup Using CAMs Proceeding of IEEE INFOCOM Conference," Mar.-Apr. 1993, pp. 1382-1391.
Knuth, D., "The Art of Computer Programming," vol. 3, Sorting & Searching, 1973, pp. 481-485 and pp. 490-493.
Fast IPv4 and IPv4 CIDR Address Translation and Filtering Using the MUAC™ Routing CoProcessor (RCP), Music Semiconductors, Application Note AN-N25, Oct. 1, 1998, pp. 1-16.

* cited by examiner

Primary Examiner—Tuan V. Thai
(74) Attorney, Agent, or Firm—Dickstein Shapiro LLP

(57) ABSTRACT

An apparatus and method that utilizes partial ordering of ternary hierarchical addresses and their associated masks entries in both binary and ternary content addressable memories (CAMs) for providing fast searches and while reducing address table size used in the processing of communication system (e.g., Internet Protocol (IP), layer-3 switches and ATM switches using E.164 addressing) addresses for identifying the source and destination of each digital packet data.

32 Claims, 20 Drawing Sheets

| ENTRY | NUMBER | ROUTING DESTINATION |
|---|---|---|
| A | 908 979 XXXX | STATION NUMBER |
| B | 908 852 XXXX | CENTRAL OFFICE 852 |
| C | 908 XXX XXXX | 908 TANDEM SWITCH |
| D | XXX XXX XXXX | LONG DISTANCE POINT-OF-PRESENCE |

FIG. 1
PRIOR ART

| ENTRY | NUMBER | NUMBER | ROUTING DESTINATION |
|---|---|---|---|
| A | 908 XXX XXXX | | EXAMINE LIST THAT FOLLOWS |
| A.a | | 908 979 XXXX | STATION NUMBER |
| A.b | | 908 852 XXXX | CENTRAL OFFICE 852 |
| A.c | | 908 XXX XXXX | 908 TANDEM SWITCH |
| B | XXX XXX XXXX | | LONG DISTANCE POINT-OF-PRESENCE |

FIG. 2

| ENTRY | NUMBER | LEVEL | ROUTING DESTINATION |
|---|---|---|---|
| A | 908 979 XXXX | 3 | STATION NUMBER |
| B | 908 852 XXXX | 3 | CENTRAL OFFICE 852 |
| C | 908 XXX XXXX | 2 | 908 TANDEM SWITCH |
| D | XXX XXX XXXX | 1 | LONG DISTANCE POINT-OF-PRESENCE |

FIG. 3

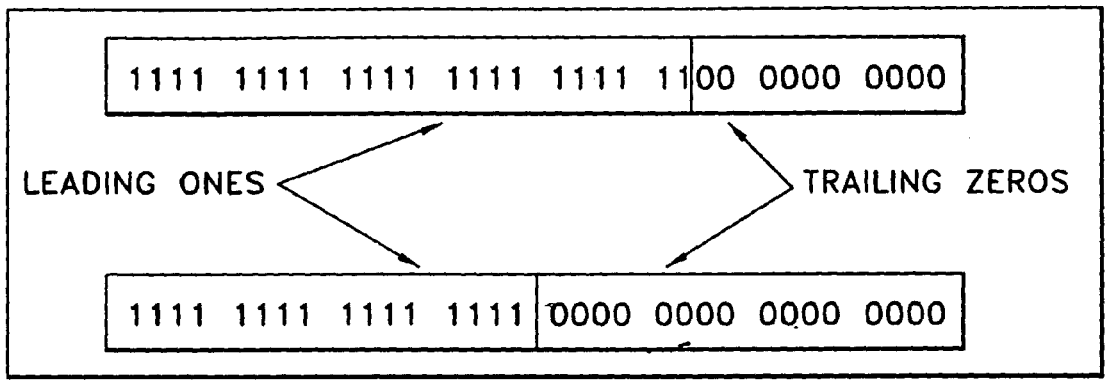
FIG. 7
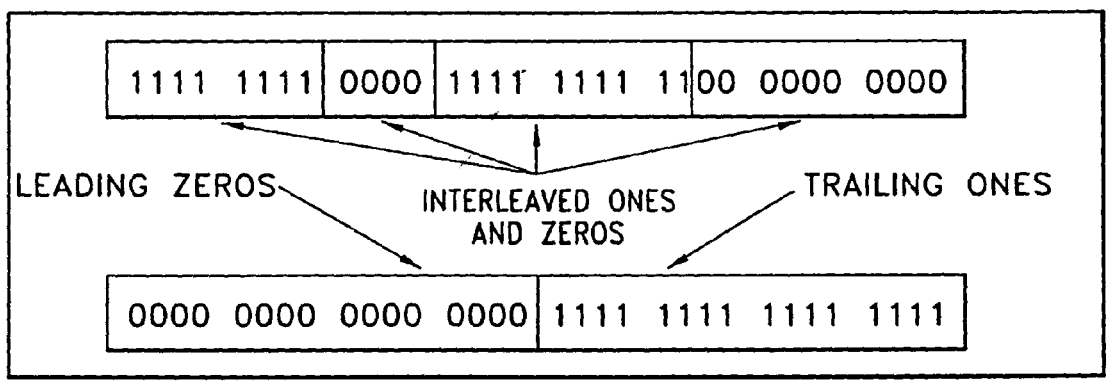
FIG. 8
| ADDRESS | MASK |
|---|---|
| C0.18.0C.15 | FF.FF.FF.FF/32 |
| C0.18.0C.10 | FF.FF.FF.F0/28 |
| C0.18.0C.00 | FF.FF.FC.00/22 |
| C0.18.00.00 | FF.FF.00.00/16 |
FIG. 9

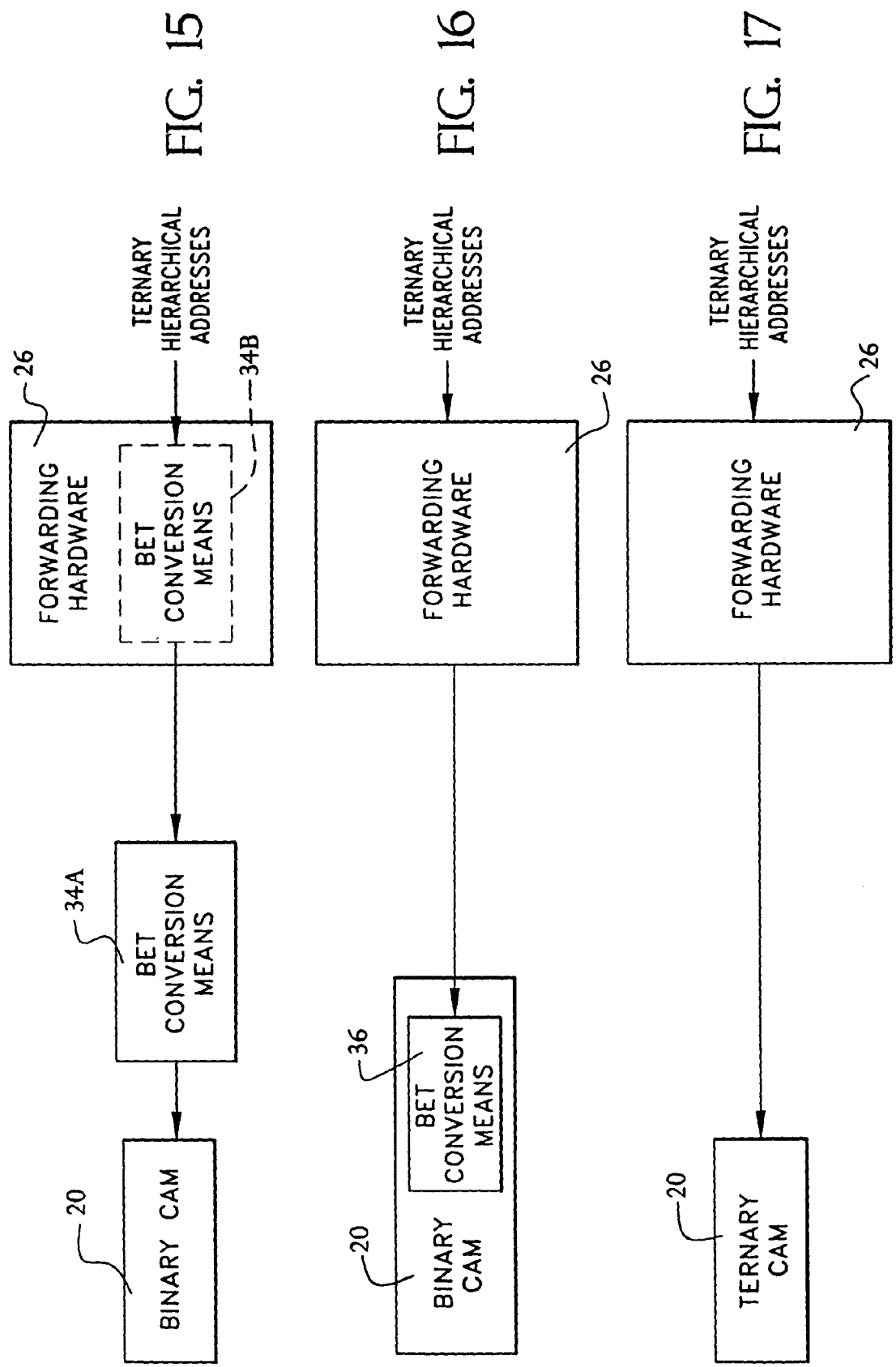

| 63 | 32 | 31 | 0 |
|---|---|---|---|
| ADDR AND MASK | | (!ADDR) AND MASK | |
| C0.18.0C.15 | | 3F.E7.F3.EA | |

FIG. 18

| TERNARY | BINARY ENCODED |
|---|---|
| 0 | 01 |
| 1 | 10 |
| X | 00 |

FIG. 19

| COMPARAND BITS | 10(1) | 10(1) | 10(1) |
|---|---|---|---|
| MASK BITS | 10 | 10 | 10 |
| CAM BITS | 00(X) | 01(0) | 10(1) |
| RESULT | MATCH | NO-MATCH | MATCH |

FIG. 20

| COMPARAND BIT | 0 | 1 | 0 | 1 | 0 | 1 | 0 | 1 |
|---|---|---|---|---|---|---|---|---|
| MASK BIT | 0 | 0 | 1 | 1 | 0 | 0 | 1 | 1 |
| CAM BIT | 0 | 0 | 0 | 0 | 1 | 1 | 1 | 1 |
| RESULT | MATCH | NO-MATCH | MATCH | MATCH | NO-MATCH | MATCH | MATCH | MATCH |

FIG. 21

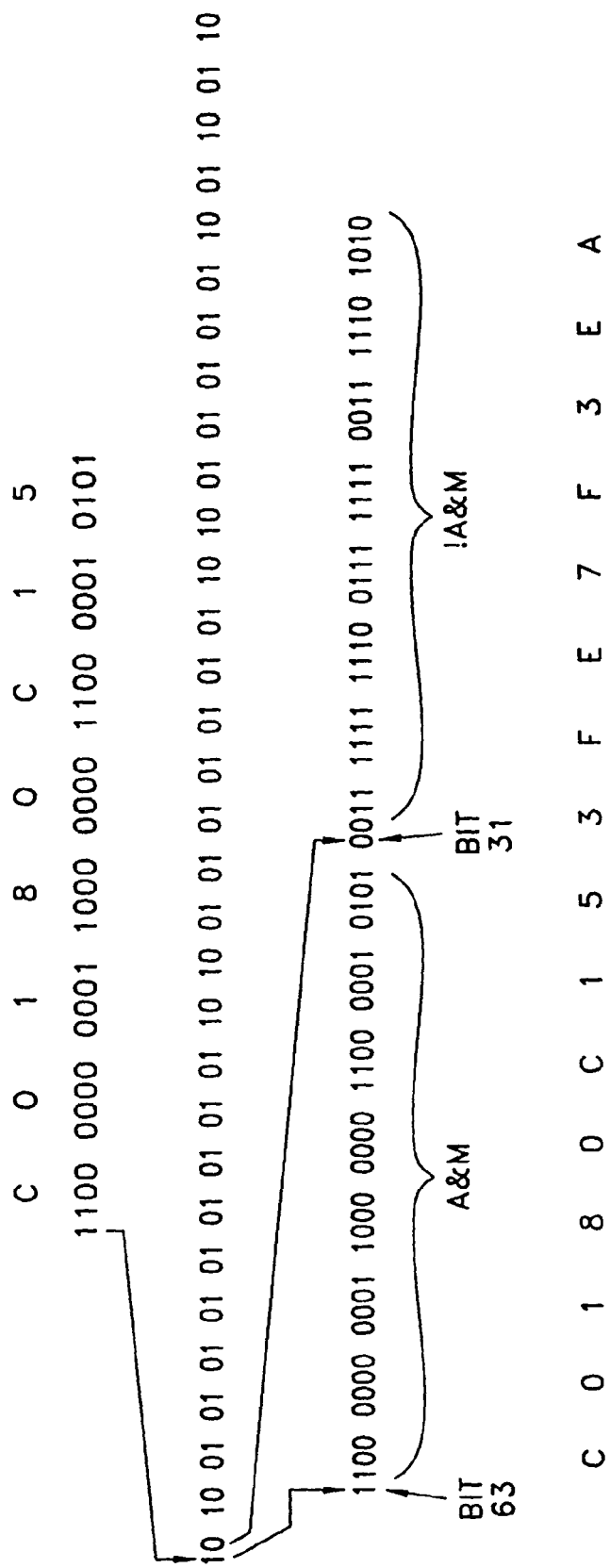

| ENTRY | IP ADDRESS | IP MASK | CAM BITS [63:32] | CAM BITS [31:0] |
|---|---|---|---|---|
| 1 | C0.18.0C.15 | FF.FF.FF.FF | C0.18.0C.15 | 3F.E7.F3.EA |
| 2 | C0.18.0C.10 | FF.FF.FF.F0 | C0.18.0C.10 | 3F.E7.F3.E0 |
| 3 | C0.18.0C.00 | FF.FF.FC.00 | C0.18.0C.00 | 3F.E7.F0.00 |
| 4 | C0.18.00.00 | FF.FF.00.00 | C0.18.00.00 | 3F.E7.00.00 |

FIG. 24

| COMPARAND REGISTER | 1100 0000 0001 1000 0000 1100 0001 0101 0011 1111 1110 0111 1111 0011 1110 1001 |
|---|---|
| MASK REGISTER | 1100 0000 0001 1000 0000 1100 0001 0101 0011 1111 1110 0111 1111 0011 1110 1001 |
| CAM ENTRY | 1100 0000 0001 1000 0000 1100 0000 0000 0011 1111 1110 0111 1111 0000 0000 0000 |
| RESULT | xxyy yyyy yyyx xyyy yyyy yyyy xxyy yyyx xxxy yyyx xxxx xxxy yyxx xxxx xxyy xyyx |

NOTES:
1. x = THE RESULT WAS A "DON'T CARE" MATCH.
2. y = THE RESULT WAS A NORMAL BINARY MATCH.

FIG. 25

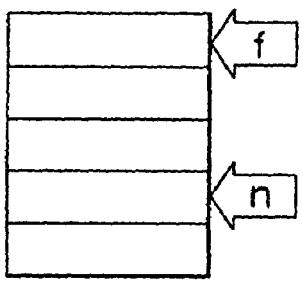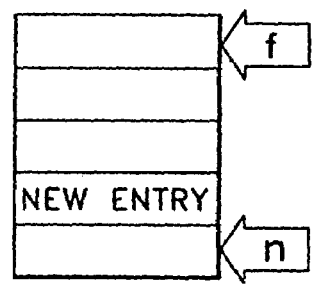
FIG. 28
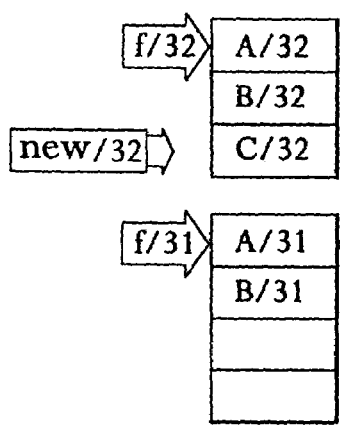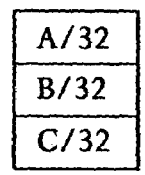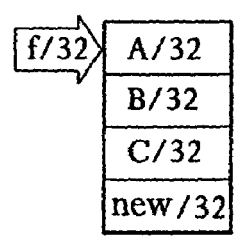
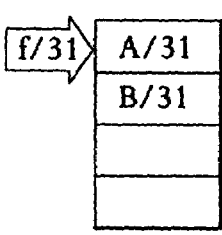 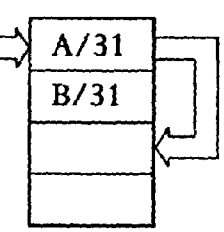 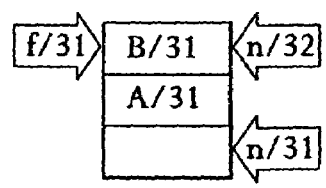
FIG. 29a  FIG. 29b  FIG. 29c

PARTIALLY-ORDERED CAMS USED IN TERNARY HIERARCHICAL ADDRESS SEARCHING/SORTING

CROSS REFERENCE TO RELATED APPLICATIONS

The present application is a continuation application of U.S. patent application Ser. No. 09/929,309, filed on Aug. 14, 2001, now abandoned which is a continuation of U.S. patent application Ser. No. 09/168,445 filed Oct. 8, 1998 and issued as U.S. Pat. No. 6,289,414 on Sep. 11, 2001, the disclosures of which are herewith incorporated by reference in their entirety.

FIELD OF THE INVENTION

The invention relates to digital hierarchical address filtering and more specifically to methods for increasing the rate at which hierarchical address filtering, such as the network address contained in a packet, can be performed.

BACKGROUND OF THE INVENTION

Address translation is the process of mapping an address, such as the network address contained in a packet, to some desired information. Examples of desired information include determining the output port of a switch to which a packet should be sent, or determining the address of the next-hop router for the routing of IP (Internet Protocol) datagrams. Address filtering is similar to address translation, except that instead of finding the data associated with some address, it is only important to determine whether a given address exists in a table of addresses. Throughout this disclosure, the phrase "address translation" encompasses both address translation and address filtering.

Addresses can be placed into two categories with regard to processing: flat and hierarchical. Flat addresses are those addresses that have no internal structure that is useful from a processing aspect. Ethernet addresses are an example of a flat address. Although Ethernet addresses have some structure to them (e.g., one part of the Ethernet address denotes the manufacturer of the equipment using the given Ethernet address), the structure is not relevant to protocol processing operations, such as routing. Many techniques have been developed for accelerating flat address translation.

Hierarchical addresses are those addresses that have an internal structure that is useful for protocol processing. Examples of hierarchical addresses include IPv4 addresses, IPv6 addresses, E.164 addresses (used in ATM-asynchronous transfer mode), and telephone numbers. To better illustrate the internal structure of a hierarchical address, a telephone number is used. Consider a telephone number: (908) 979-1010. The highest level of the hierarchy is denoted by the "area code" 908. The next level of the hierarchy is the "central office code" 979. The lowest level of the hierarchy is the "station number" 1010. The hierarchical structure of the telephone number is used to determine how to route a call through the telephone network. For example, if a call both originates and terminates in the 979 central office, then the phone call passes only through the 979 central office. If a call both originates and terminates in the 908 area, then no long-distance carrier is used to carry the call. Note that a flat address is a hierarchical address with a single level of hierarchy. Thus, any address translation techniques that operate on hierarchical address can be applied to flat addresses as well.

The main importance of the structure of hierarchical addresses is that there is no need to store information about every single address in order to be able to process all addresses. Information about entire classes of addresses can be stored in a single entry. For example, for a call that originates from area code 908 and terminates in some other area code, the correct action is to forward the call to a long distance carrier, regardless of the specific terminating area code.

The tables used for hierarchical address translation can be thought of as a sieve. Consider the following example, as shown in FIG. 1, of a translation table that might exist in the 979 central office switch (X's represent "wildcard" or "don't care" values that match all digits). Telephone numbers are compared with table entries in order from top to bottom looking for a matching entry. The telephone number 908 979 1035 would match entry A in the table, and the call would be routed to the station number 1035. The telephone number 201 829 5136 matches entry D of the table and would be routed to a long distance carrier for transport. Note that any telephone number that matches an entry also may match some of the entries that follow. The fact that entries are examined in order assures that routine is done correctly.

Other methods can be used to search the table that will provide the same result as if the table were searched serially. One technique is to use a tree structure, such as a PATRICIA (Practical Algorithm To Retrieve Information Coded In Alphanumeric) tree. *The Art of Computer Programming* (Knuth); *Introduction to Algorithms* (Cormen, Leiserson, and Rivest). The search begins at the root of the tree, which corresponds to the top of the hierarchy. FIG. 2 depicts such a search method and comprises the table of FIG. 1 rearranged as shown in FIG. 2. The first comparison would be against just the area code 908. If 908 were found, then the entries indented under 908 would be searched. Otherwise, the call will match the last line and be routed to a long distance Point-of-Presence.

Another alternative would be to search all entries in parallel. As shown in FIG. 3, the table can be augmented with explicit hierarchical levels assigned to each table entry. The telephone number 908 979 1035 matches table entries A, C and D. The desired match is entry A, which has the highest level number (3 in this case, i.e., only two entries need to be delineated A & B. The word "address" as used above may actually be a combination of data fields from a packet header that is treated as a single address for purposes of address translation. For example, the address may be a combination of source address, destination address and priority fields. It should be noted that any combination of different header elements forms a single hierarchical address, in which the different elements form part of the structure of the hierarchical address.

However, these approaches are limited by the constraints of software processing speeds and comparisons with table entries are typically performed in sequential order. Thus, as network communication speeds increase, it becomes necessary to find high-speed translation techniques to operate at wirespeed.

One way to achieve wirespeed is to utilize a content-addressable memory (CAM). CAMs differ from conventional RAM (random access memory), SRAM (static RAM) and DRAM (dynamic RAM) in that they are organized differently. In a CAM, data is stored in locations in an arbitrary fashion. The locations can be selected by an address bus, or the data can be written directly into the first empty location because every location has a special status bit that keeps track of whether the location has valid information in it or is empty and available for overwriting. Once information is stored in a memory location, it is found by comparing every bit in memory with data placed in a special Comparand register. CAMs also comprise a mask register which allows selection of which bits will participate in the comparison. If there is a match for every bit in a location with every corresponding bit in the Comparand register, a Match Flag is asserted to the user know that the data in the Comparand register was found in memory. A priority encoder sorts out which matching location has the top priority, if there is more than one, and makes the address of the matching location available to the user. Thus, a CAM is a memory device that allows retrieval of information by specifying part of the stored information, rather than by specifying a storage address. For example, using masking, if the entries hex "abcd," "abde" and "accd" were stored in a CAM, the CAM could be instructed to return the complete contents of the entries of all locations beginning "ab." In this example, the CAM would return entries "abcd" and "abde."

CAMs are generally classified as either binary or ternary CAMs. Binary CAMs store binary entries, while ternary CAMs store ternary entries (see PCT Application No. PCT/US97/13216, WO98/07160). Binary entries are entries that contain only 0 or 1 values, while ternary entries are entries that contain 0, 1, or X (i.e., "don't care") values. Note that a single ternary entry can be expressed as two or more binary entries. In other words, a single ternary entry "1X0" can be represented by two binary entries "110" or "100", or a single ternary entry "1XX" can be represented by four binary entries "100", "101", "110" or "111", etc. Since hierarchical addresses often comprise ternary values (e.g., a telephone lookup table number "908-979-XXXX"), ternary CAMs require a smaller number of table entries to represent each hierarchical address than binary CAMs. However, ternary CAMs require more complex hardware and are generally more expensive than binary CAMs. (see U.S. Pat. No. 5,319,590 (Montoye)). In particular, one method to construct a ternary CAM is to design the CAM cells and sense amps to enable the storage of three distinct voltage levels (high, medium and low) which would correspond to the ternary values.

The following provides a summary of existing searching methods using CAMs.

Expanding Each Ternary Entry into Multiple Binary Entries

While hierarchical addresses can be directly stored in ternary CAMs, in order to be stored in binary CAMs they must first be translated into binary format. As discussed above, a ternary address can be translated into two or more binary addresses. However, the number of binary addresses needed to represent a ternary address is $2^m$, where m is the number of bits required to represent each "don't care" value (X) in the ternary address. For example, the ternary address $ABCD\_123X_{hex}$, where "X" indicates the "don't care" value, covers the set of binary addresses given by $\{ABCD\_1230_{hex}; ABCD\_1231_{hex}; \ldots ABCD\_123F_{hex}\}$ where m=4 to cover the range 0 to F. Hence, the ternary address $ABCD\_123X_{hex}$ requires 16 (i.e., $2^4$) entries in the binary CAM. To that end, in accordance with application Ser. No. 08/818,073, filed on Mar. 14, 1997, entitled "Accelerated Hierarchical Address Filtering and Translation," (now U.S. Pat. No. 5,920,886), which is assigned to the same assignee as the present invention, namely, Music Semiconductors, Inc., and all of whose disclosure is incorporated by reference herein, there is disclosed a method for storing such entries in a binary CAM acting as a ternary CAM but not having to store these entries in sequential order.

Hierarchical Level Field Searches

Another search technique involves the use of entries in a ternary CAM with a hierarchical level field, using a linear search of this level field. *Fast Routing Table Lookup Using CAMs*, (McAuley and Francis, 1993). In particular, this technique uses a ternary CAM to store ternary addresses and wherein each ternary address comprises an associated level field. The entries may be stored in the CAM in any order. The following is an example of how an address and mask are stored. The ternary address, $ABCD\_123X_{hex}/28$ (where "28" indicates the number of contiguous ones in the mask), would be stored in the CAM as:

ternary field=$ABCD\_123X_{hex}$ priority field=$11100_{binary}$ (where $11100_{binary}=28_{decimal}$)

The technique then begins searching from the lowest priority level (i.e., the level with the longest network mask, viz., $11111_{binary}$) and working towards the higher levels, depending upon whether there are any matches. The search is altered based on the level field. The hierarchical address is not masked during the search and only parts of the level field are masked. If a match is found, the search is complete; if there are no matches, the level field is decremented and the search continues. The worst case number of searches is the number of distinct hierarchical levels, N.

Entries in Ternary CAMs with Hierarchical Level Field. Binary Search of Level Field Another technique, that is an improvement of the Hierarchical Level Field Searches, (described above), is disclosed in application Ser. No. 08/818,073, filed on Mar. 14, 1997, entitled "Accelerated Hierarchical Address Filtering and Translation", (now U.S. Pat. No. 5,920,886), which is also assigned to the same assignee as the present invention, namely, Music Semiconductors, Inc., and all of whose disclosure is incorporated by reference herein. In this technique, instead of starting at the lowest level of the hierarchy (comprising N hierarchical levels) and working up (i.e., Hierarchical Level Field Searches), this search technique starts in the middle and eliminates from consideration one half of the remaining hierarchical levels during each iteration. In particular, the search starts in the middle mask (i.e., MM=N/2) and, as an example, N=32. Depending upon the search result, the search either moves up or down MM/2 mask levels and tries again. The search begins looking for matches with the level field 1XXX, which will match against priority levels 16–31 since:

$16_{decimal}=10000$ $17_{decimal}=10001$ $24_{decimal}=11000$ $31_{decimal}=11111$ If there are multiple matches in this range (16–31), the mask is changed to 11XXX (i.e., replace the most significant X of the priority mask with a "1"). By doing so, the search range is halved, resulting in a new smaller range, viz., 24–31. After searching with the new mask, if there is one match, the search is complete; if there is no match, the least significant 1 of the priority mask is replaced with a 0 (i.e., the new mask is now 10XXX) so that the range of 16–23 is now searched.

If, on the other hand, there are no matches in this range (16–31) when the original mask 1XXX was used, the mask is changed to 0XXX which means that the search is now looking at the range 0–15 of the priority masks, since:

$$0_{decimal}=00000$$

$$1_{decimal}=00001$$

$$8_{decimal}=01000$$

$$15_{decimal}=01111$$

After searching with the new mask, if there is one match, the search is complete; otherwise, the search process is repeated by replacing the most significant X with a 1 (i.e., 01XX, searching the range 8–15). If there is no match, the least significant 1 is replaced with a 0 (i.e., 00XX, searching The range 0–14) and the process repeated until a match is found.

This technique is depicted in FIG. 4 and can be summarized as follows: The ternary CAM is first searched for an address and a priority field having a 1 in the most significant bit position and an X in all other bit positions, in stage 2. Stage 4 then determines if there are any matching entries, in which case, the operation proceeds to stage 8; otherwise, the least significant bit in the priority field having a value of 1 is replaced by a value of 0 in stage 6. Stage 8 then determines whether any bits of the priority field have a value of X, in which case, the most significant bit in the priority field having a value of X is replaced by a value of 1 in stage 10. The CAM is then searched for the address and the modified priority field, in stage 12. Stage 14 determines whether there is a single matching entry, in which case, the matching entry is retrieved from the CAM in stage 16; otherwise, stages 4–14 are repeated until the test of stage 14 is satisfied and the operation terminates. Thus, one X is resolved (i.e., replaced by a 1 or a 0) after each search until a matching entry is found.

This technique requires, in the worst case, a number of searches equal to the number of bits used to represent the priority field (i.e., if N is the number of hierarchical levels represented by the priority field, $\log_2 N$ searches are required to find a matching entry at the lowest hierarchical level, as all bits of the priority mask must be resolved).

Full-Sorted Order with Different Masks

Another technique disclosed in *Fast Routing Table Lookup Using CAMs*, (McAuley and Francis, 1993) comprises the storage of entries in full-sorted order in a binary CAM with linear searching of the hierarchy using different mask registers. Binary entries are stored in a binary CAM and the CAM entries must be ordered inversely by level of hierarchy. Instead of using priority masks, this technique masks off the address being searched in a manner similar to how the priority masks are decremented, as described above under "Hierarchical Level Field Searches". In particular, this technique (shown in FIG. 5) starts with the most precise mask of all "care" bits in the mask register and searches the CAM through the mask register. For example, for a 32-bit address search, the technique would begin with all "0's" in the mask register (a /32 mask), where "0"s correspond to "care" and "1"s correspond to "don't cares" in a CAM search through a mask. If there is a match, the search is completed and the top CAM match (i.e., the lowest CAM address) is selected. If there is no match, the technique moves down to the next highest mask value, which is /31 in this case. The search is repeated again through the mask register, repeating the process until a single match is received. The worst case number of searches is N searches, where N is the number of hierarchical levels.

Entries in Full-Sorted Order in Binary CAM with Binary Search of Hierarchy Using Different Mask Registers This technique, as disclosed in application Ser. No. 08/818,073, filed on Mar. 14, 1998, entitled "Accelerated Hierarchical Address Filtering and Translation", (now U.S. Pat. No. 5,920,886), is an improvement to Full-Sorted Order with Different Masks (discussed above) by providing a search to $\log_2 N$. This technique also starts with the median, or half-way mask, which would be the /16 mask in a 32 mask level address scheme. If there is a single match, the search is complete. If there are multiple matches, the search moves to the mask half-way up, which is the /24 mask in this iteration and the search continues. If there are still no matches, the search moves the other way and half-way down, i.e., to the /8 mask in this iteration and the search continues. This process is repeated until one match is found or until no matches are found, in which case the highest priority match from the last multiple match search is selected.

Full-Sorted Order

This technique is disclosed by *Fast Routing Table Lookup Using CAMs*, (McAuley and Francis, 1993) and is shown in FIG. 6. In this technique, ternary entries are stored in sorted, i.e., inverse hierarchical, order. A search takes a single cycle because the search obtains the longest match address which is stored at the lowest CAM address. The major advantage of this approach is the ideal one search cycle address resolution time. On the other hand, the downside of this technique is the required resorting which makes this technique impractical.

IP Classless Inter Domain Routing (CIDR)

The present invention can be implemented in any type of communication system where hierarchical addressing and associated address masks are used. As an example, as will be disclosed below, the present invention can operate on the IP Classless Inter Domain Routing (CIDR) to find the "longest match" in an IP routing table. CIDR is a common method of reducing address table size, which categorizes address aggregations on arbitrary mask bit boundaries. CIDR reduces the size of IP tables by making it possible to group thousands of entries under one entry in the CIDR table. FIG. 7 shows two examples of how the 32-bit network mask values are structured according to Internet Request For Comments 940 and 1519. The masks always have a structure consisting of contiguous "0"s on the right. A mask never has "1"s and "0"s interleaved, or "0"s on the left and "1"s on the right. FIG. 8 shows examples of invalid mask structures.

FIG. 9 shows four entries from a CIDR routing table (in hexadecimal format) and the network masks that relate to them. It can be seen that the mask boundaries are clearly demarcated. The number after the backslash indicates the number of continuous ones in the mask. For example, the first entry's mask is FF.FF.FF.FF, which corresponds to 32 bits set to 1. This mask is an IP mask, where a 1 indicates a "care" location and a 0 indicates a "don't care." A "care" bit means that the corresponding bit locations of the numbers being compared must be identical. A "don't care" bit indicates that the bit locations are not used in the comparison. The more the number of 1-bits or "cares" in a mask, the less the number of possible matches. Therefore, a higher mask number is more precise than a lower mask number. Note, an IP address search may match multiple CIDR routing table entries because masking is used to further specify smaller address ranges.

In FIG. 9, the last address/mask entry actually corresponds to 1100 0000 0001 1000 XXXX XXXX XXXX XXXX where the X's stand for "don't cares." Any search value whose top 16 bits equal 1100 0000 0001 1000 would match the last entry. Note that in FIG. 9, the entries are ordered by mask value from most 1s (FF.FF.FF.FF) to the entry with the least number of 1s (FF.FF.00.00, in this case). A search for CO.18.0C.15 would yield matches on all the entries but the first entry is chosen because it is the match with the longest group of 1s in the mask (the so-called "longest match"). A search for CO.18.0C.16 would match only the second, third, and fourth entries.

When multiple matches occur during a search, CAMs select the "best" entry by their physical addresses. Matches with lower addresses are selected over matches with higher addresses. For example, if a search yields matches at CAM address 1 and 2, the match at address 1 is selected. In a typical layer 2 address filtering application, the order of the entries in the CAM is unimportant because it is expected that there will be no more than one match result from any given search.

However, hierarchical address structures like IPv4, IPv4 CIDR, and IPv6 differ by having the possibility of having multiple matches during a search operation. The best match is the "longest match," or the entry has the largest number of contiguous "cares" or 1s. Therefore, if a CAM is used to store hierarchical addresses, sorting is necessary. There are two alternatives for this sorting: sorting when inserting entries, or sorting when reading matches. Fast hardware lookup for high bandwidth routing and switching places an emphasis on high-speed searches. Choosing to sort when inserting entries is therefore a logical decision because it enables fast constant time address resolution.

Thus, as network communication speeds increase, there remains a need to conduct hierarchical address translation at wirespeed, rather than relying on software techniques as is practiced in conventional translation techniques, or on present CAM techniques. In particular, there remains a need for a method of sorting entries in the CAM to obtain the longest match in the shortest amount of time.

OBJECTS OF THE INVENTION

Accordingly, it is the general object of this invention to provide an apparatus which improves upon and overcomes the disadvantages of the prior art.

It is another object of this invention to provide faster hierarchical address translation to most any hierarchical data.

It is another object of this invention to provide faster hierarchical address translation by utilizing address resolution/search that is always completed in one CAM search cycle.

It is still another object of this invention to provide an apparatus and method having a sorting mechanism whose worst case cost for inserting new entries is proportional to the number of masks and is not proportional to the number of entries.

It still yet another object of this invention to provide an apparatus and method whereby entries only need be sorted by mask levels which means that ordering inside mask levels is irrelevant.

It is even yet a further object of this invention to provide an apparatus and method using a sorting method whereby table updates can be successfully interrupted by searches as long as the current maintenance atomic operation (e.g., an insert operation) is allowed to complete.

It is still yet a further object of this invention to provide an apparatus and method whereby each binary code pair, used to represent a ternary value, are stored at n and n+32, thus making the binary to ternary conversion easy to compute using a general purpose processor.

It is still yet a further object of this invention to provide an apparatus and method whereby the binary encoded ternary conversion is accomplished inside the CAM itself to reduce the input/output bandwidth.

It is another object of this invention to provide an apparatus and method for faster hierarchical address translation for IP datagram routers.

It is still another object of this invention to provide an apparatus and method for faster hierarchical address translation for layer-3 switches.

It is still yet another object of this invention to provide an apparatus and method for faster hierarchical address translation in ATM switches during connection setup for the translation of hierarchical E.164 addresses.

It is still yet another object of this invention to provide an apparatus and method for faster hierarchical address translation for data communication.

It is still yet another object of this invention to provide an apparatus and method for faster hierarchical address translation for multimedia communication.

It is still yet another object of this invention to provide an apparatus and method for faster hierarchical address translation for integrated service communication.

It is even a further object of this invention to provide an apparatus and method for the encoding of ternary addresses in binary CAMs.

It is yet another object of this invention to provide an apparatus and method for obtaining the longest-match ternary address resolution in a single search cycle of a binary CAM.

It is still yet a further object of this invention to provide an apparatus and method for maintaining a sorted routing table for search techniques for binary CAMs.

It is still yet another object of this invention to provide an apparatus and method for maintaining a sorted routing table for ternary CAM.

SUMMARY OF THE INVENTION

These and other objects of the instant invention are achieved by providing a content addressable memory (CAM) of a communications system (e.g., data and telecommunication systems, network systems such as Internet Protocol, (IP), layer-3 switches and asynchronous transfer mode (ATM) used in E.164 addressing) utilizing ternary hierarchical addressing and associated address masks. The CAM (e.g., a ternary CAM or a binary CAM) comprises a plurality of address entries and associated address masks that are arranged in the CAM by mask number, with address entries having the highest mask number being located at address entry locations at the top of the CAM and address entries having the lowest mask number being located at address entry locations at the bottom of the CAM (known as "partial ordering"). The mask number is defined as the number of contiguous ones in an associated address mask.

These and other objects of the instant invention are also achieved by providing an apparatus for storing a plurality of address entries and associated address masks in a communication system (e.g., data and telecommunication systems, network systems such as Internet Protocol, (IP), layer-3 switches and asynchronous transfer mode (ATM) used in E.164 addressing) utilizing ternary hierarchical addressing and associated address masks. The apparatus comprises a binary CAM and a binary-encoded ternary (BET) conversion means coupled to the binary CAM wherein the BET conversion means converts each ternary value into a corresponding BET value to form the address entries. Furthermore, the plurality of address entries and associated address masks are arranged in the binary CAM by mask number, with address entries having the highest mask number being located at address entry locations at the top of the CAM and address entries having the lowest mask number being located at address entry locations at the bottom of the CAM (known as "partial ordering"). The mask number is defined as the number of contiguous ones in an associated address mask.

These and other objects of the instant invention are also achieved by providing a method for accelerating the routing of hierarchical addressing in a communication system which utilizes ternary hierarchical addressing and associated address masks (e.g., data and telecommunication systems, network systems such as Internet Protocol, (IP), layer-3 switches and asynchronous transfer mode (ATM) used in E.164 addressing). The method comprising the steps of: (a) obtaining communication system hierarchical addresses and associated masks to form address entries; and (b) storing the address entries in a content-addressable memory (CAM) by mask number wherein the mask number is defined as the number of contiguous ones in an associated address mask and wherein address entries having the highest mask number are stored in address entry locations at the top of the CAM and address entries having the lowest mask number are stored at address entry locations at the bottom of the CAM (known as "partial ordering").

These and other objects of the instant invention are also achieved by providing a method for maintaining a sorted CAM to enable longest matches in a single search cycle when hierarchical addresses are added to, or deleted from, the CAM in a communication system utilizing hierarchical addresses and associated address masks (e.g., data and telecommunication systems, network systems such as Internet Protocol, (IP), layer-3 switches and asynchronous transfer mode (ATM) used in E.164 addressing). The method (known as "block-edge sorting") comprises the steps of (a) segmenting the CAM into blocks wherein each block corresponds to a single hierarchical mask and wherein the blocks are arranged in the CAM such that the highest hierarchical masks are located at the lowest CAM addresses and the lowest hierarchical masks are located at the highest CAM addresses; (b) storing hierarchical addresses according to the block having a corresponding hierarchical mask; and (c) tracking (1) the first address of each of the blocks (floor); (2) the next free address of each of the blocks (nxtfree); and (3) the size of each of the blocks.

DESCRIPTION OF THE DRAWINGS

Other objects and many of the attendant advantages of this invention will be readily appreciated as the same becomes better understood by reference to the following detailed description when considered in connection with the accompanying drawings wherein:

FIG. 1 is a prior art telephone number translation table;

FIG. 2 is the translation table of FIG. 1 re-arranged for conducting PATRICIA tree searching;

FIG. 3 is the translation table of FIG. 1 augmented by particular hierarchical levels, thereby permitting parallel searching;

FIG. 7 is a diagram of the structure of valid network masks;

FIG. 8 is a diagram of the structure of invalid network masks;

FIG. 9 is a diagram of addresses and masks from a CIDR routing table;

FIG. 15 depicts a binary CAM with external binary-encoded ternary (BET) conversion means in a portion of a communication system using the present invention;

FIG. 16 depicts a binary CAM with internal binary-encoded ternary (BET) conversion means in a portion of a communication system using the present invention;

FIG. 17 depicts a ternary CAM in a portion of a communication system using the present invention;

FIG. 18 depicts the contents of the binary CAM when binary-encoded ternary (BET) conversion of the present application is applied;

FIG. 19 depicts the binary encoding of ternary values;

FIG. 20 depicts the CAM compare truth table with ternary values;

FIG. 21 depicts the CAM compare truth table; 10 FIG. 22 depicts the storage of the IP address/IP mask of FIG. 18 in bits;

FIG. 23 depicts the relationship between the upper bits of FIG. 22 (CO.18.0C.15) and the lower bits (3F.E7.F3.EA) of FIG. 22, the latter of which is the one's complement of the upper bits;

FIG. 24 depicts a plurality of IP addresses/IP mask entries stored in the binary CAM in accordance with the present invention;

FIG. 25 depicts the compare results in accordance with the present invention;

FIG. 28 depicts insertion of a new hierarchical address entry into a non-full block;

FIGS. 29a–29c together depict the method for insertion of a new hierarchical address entry using one edge sort;

DETAILED DESCRIPTION OF THE PREFERRED EMBODIMENT

Figure 4:
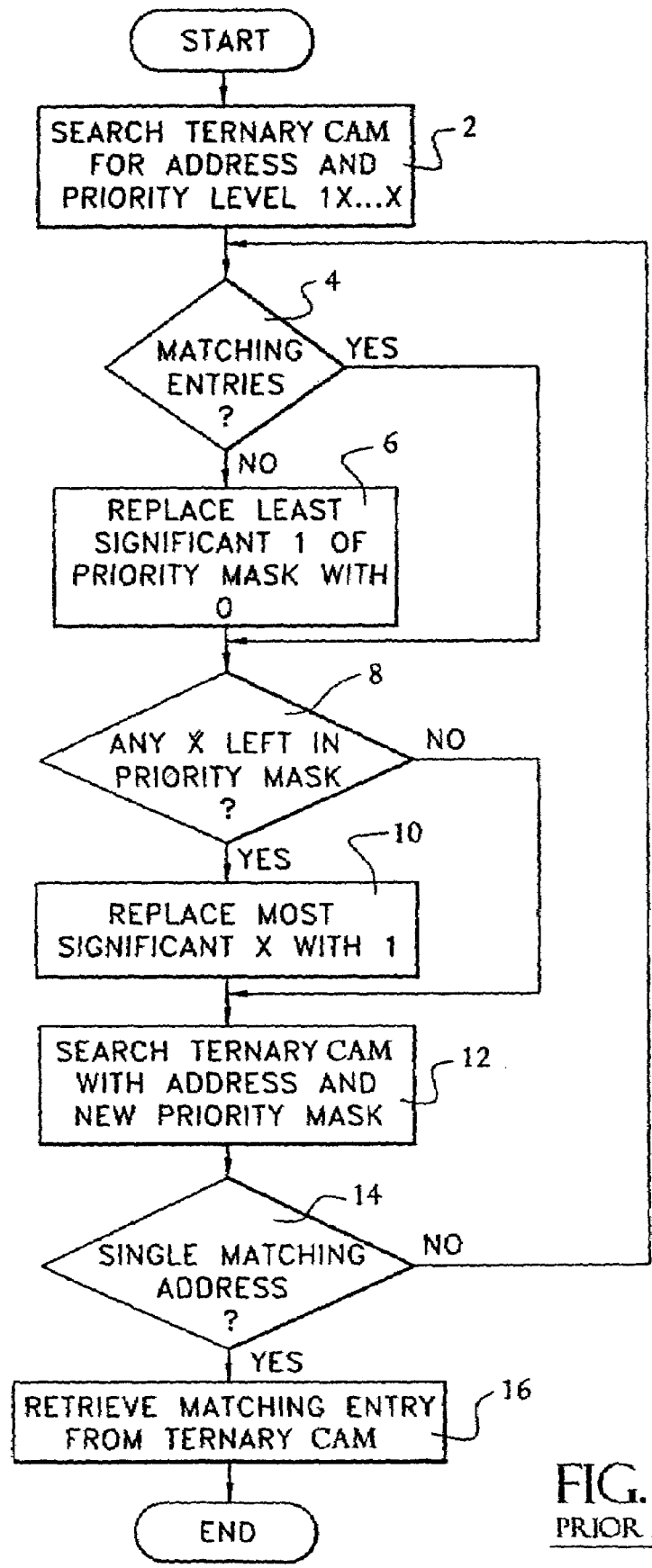
FIG. 4 is a flow diagram for a prior art CAM search technique: Entries in Ternary CAMs with Hierarchical Level Field, Binary Search of Level Field.
Figure 5:
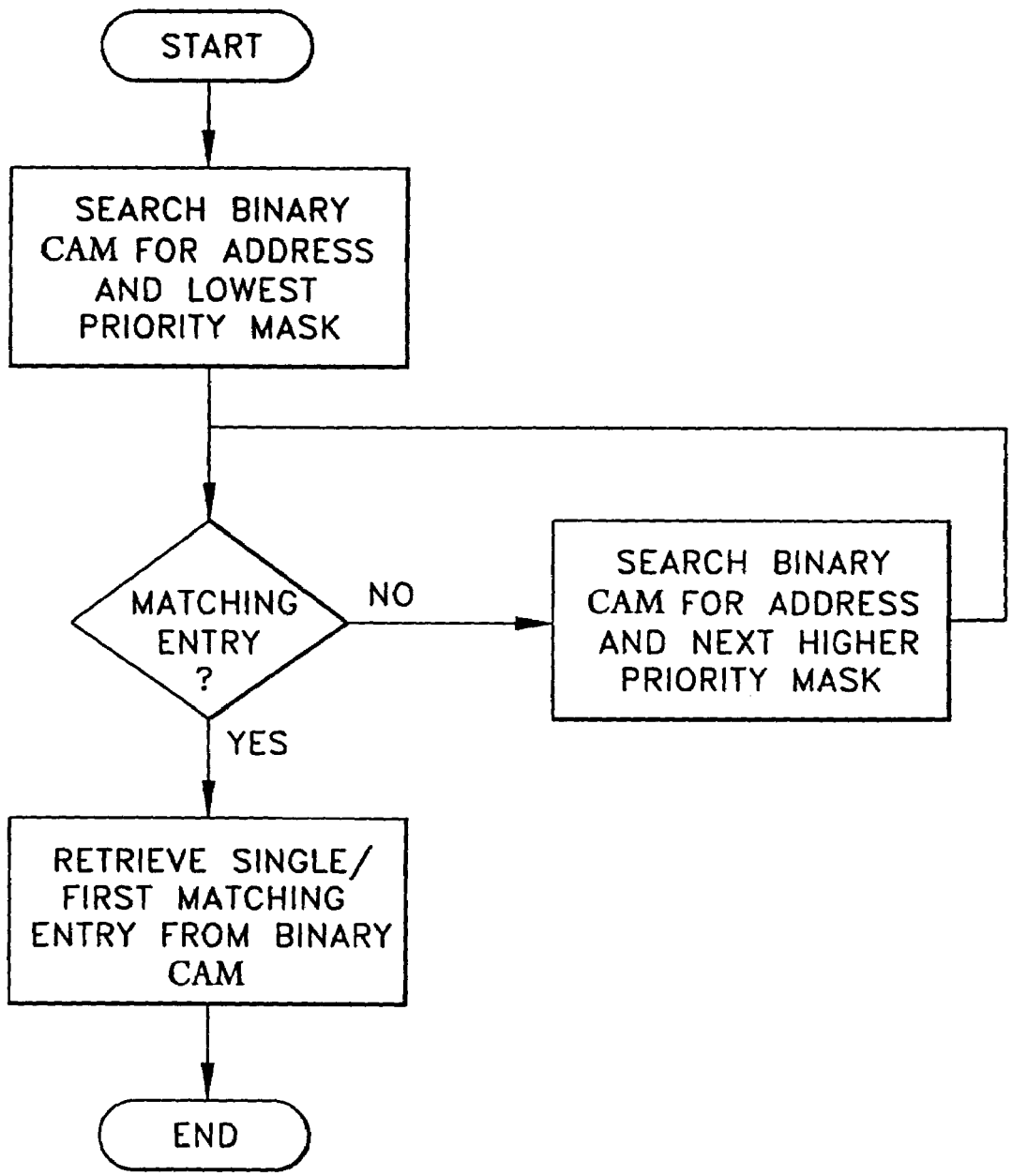
FIG. 5 is a flow diagram for another prior art CAM search technique: Full Sorted Order with Different Masks.
Figure 6:
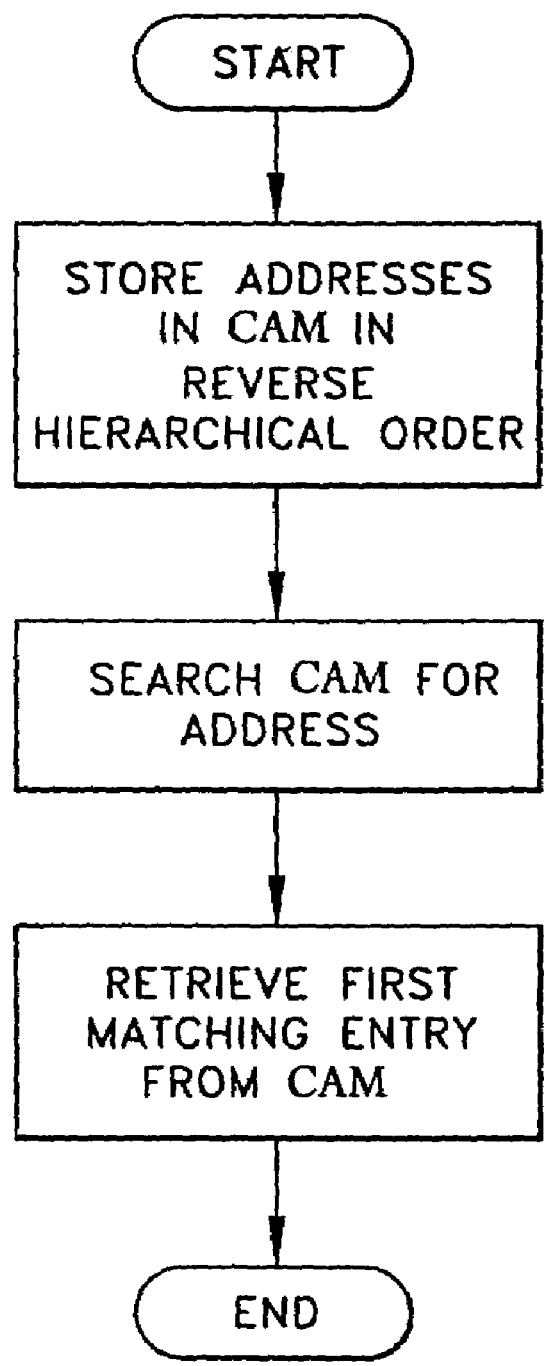
FIG. 6 is a flow diagram for another prior art CAM search technique: Full Sorted Order.
Figure 10:
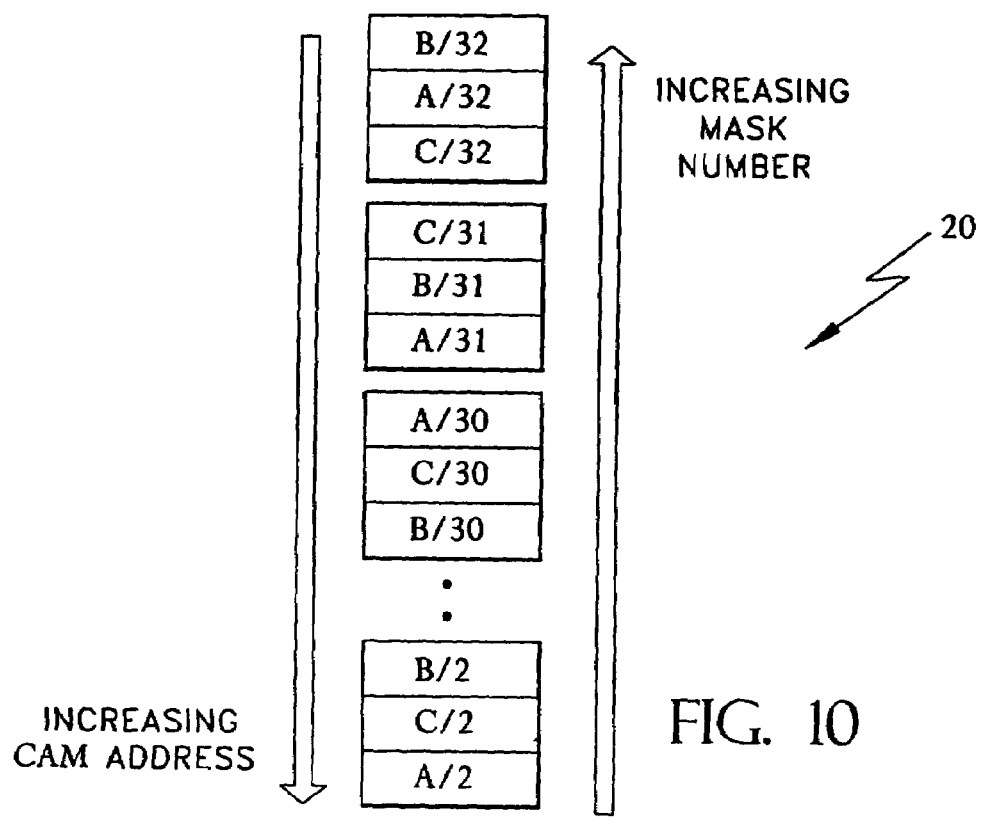
FIG. 10 depicts a CAM using partial ordering in accordance with the present invention.
Figure 11:
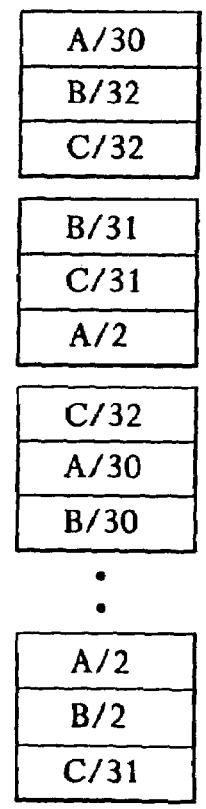
FIG. 11 depicts a CAM that does not use partial ordering.
Figure 12:
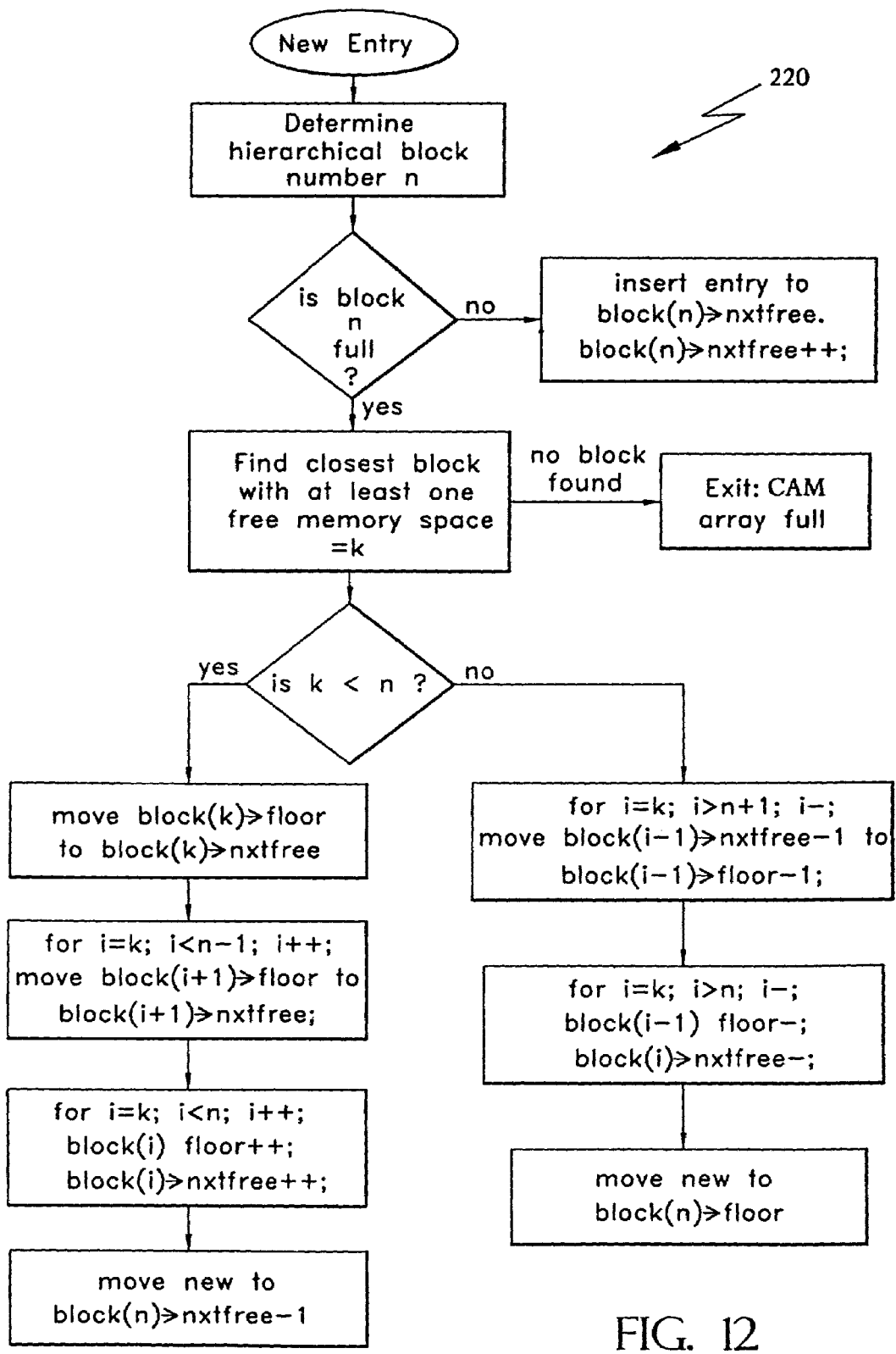
FIG. 12 is a flowchart for establishing partial ordering in a CAM.

Referring now in detail to the various figures of the drawing wherein like reference characters refer to like parts, there is shown at 20 in FIG. 10, a CAM in which the address entries are arranged by mask number (i.e., the number of contiguous ones in the mask), from the highest mask number at the top of the CAM 20 to the lowest mask number at the bottom, irregardless of the sequence of the addresses themselves. This arrangement, hereinafter known as "partial ordering (PO)", is depicted in that the addresses A, B, and C are not in alphabetical order, but are stored in the CAM in groups having the same mask number and whereby these groups are stored in descending mask number order (which, by definition, is in increasing CAM address order). On the other hand, FIG. 11 depicts a CAM that does not use PO. FIG. 12 depicts a method 220 for optimally implementing a partially-ordered CAM 20, hereinafter known as "block-edge sorting (BES)", and will be discussed in detail later. Suffice it to say for now that the "block-edge sorting" method is a specific application of PO.

Partial ordering incorporates significant advantages over the number of masks used in hierarchical address schemes. The primary search advantage is that the address resolution/ search is always completed in one CAM search cycle. Furthermore, the primary sorting advantage to this approach is that the worst case cost for inserting new entries is proportional to the number of masks ($N_{mask}$), and is not proportional to the number of entries.

The crucial realization of this algorithm is that entries only need to be sorted by mask levels which means that ordering inside mask levels is irrelevant. Another advantage to the sorting method is that table updates can be successfully interrupted by searches as long as the current maintenance atomic operation (e.g., an insert) is allowed to completion.

At this point, it should be understood that the CAM 20 includes both binary CAMs, as well as ternary CAMs, for storing the ternary hierarchical addresses. As such, it is within the broadest scope of the present invention that PO and BES can be implemented using either binary CAMs or ternary CAMs. Where a ternary CAM is used, the ternary hierarchical address being stored (e.g., C0180000/16, the "C018" being hexadecimal values and the "16" indicating the number of "cares") would simply be stored as is (i.e., C018XXXX). Where a binary CAM is used, the additional steps of first converting the ternary hierarchical address into binary-encoded ternary (BET) and then storing the BET address in a unique manner (hereinafter, BETAS) in the binary CAM is discussed below. Thus, the following discussion is directed to the more-involved situation where a binary CAM is used, it being understood that use of a ternary CAM would be a simpler case that would skip these additional steps.

Figure 13:
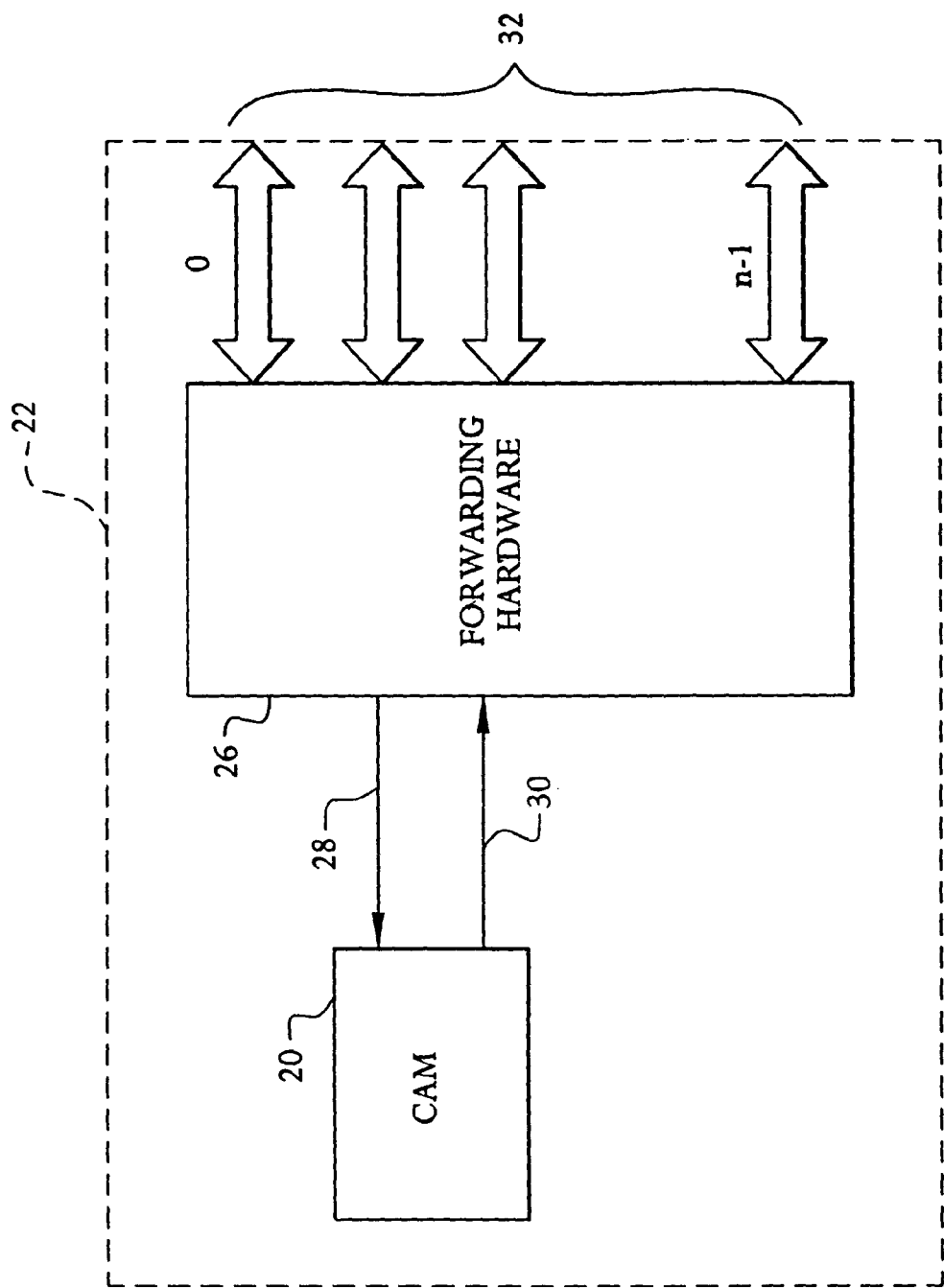
FIG. 13 shows a portion of a communication system where a CAM using partial ordering is used.
Figure 14:
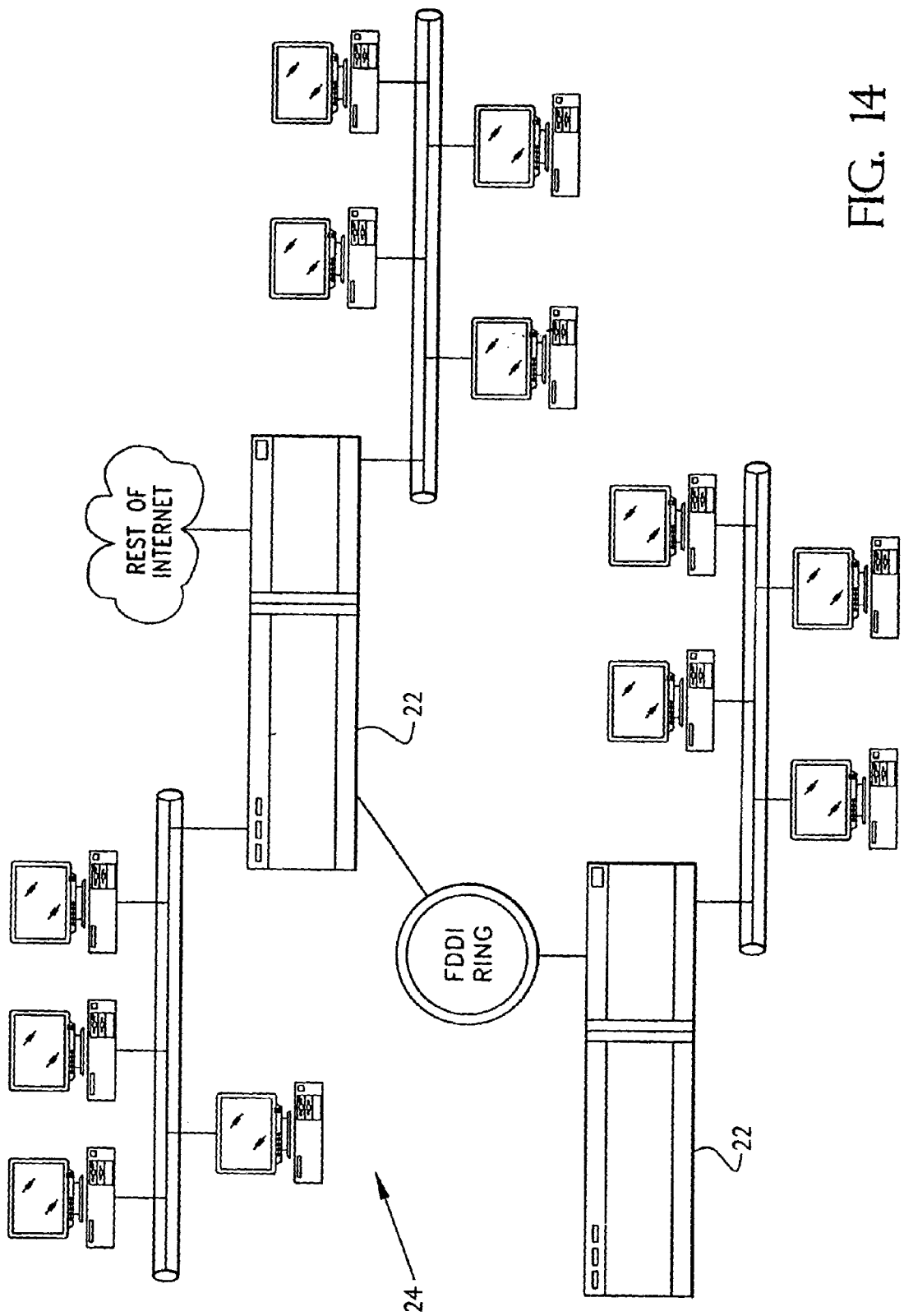
FIG. 14 depicts an exemplary communication system which uses CAMs.

As shown in FIG. 13, the CAM 20 using PO forms a portion (e.g., an n-port router 22 that utilizes the CAM 20 for forwarding decisions) of a communications system (e.g., network 24, FIG. 14). The CAM 20 interfaces with forwarding hardware 26 via a search data line 28 and routing decision line 30. The forwarding hardware 26 forms n network interfaces 32. It should be understood that the network 24 is exemplary only and that it is within the broadest scope of this invention to include the CAM 20 using PO in any type of communication system, e.g., telecommunication system, data communication system, etc.

To place hierarchical entries in the CAM 20, it is necessary to sort their position in the CAM 20 so that the longest match is selected first. Since CAMs select the best match by lowest CAM address value, the entries with the longest match mask are stored in the lowest CAM addresses. If the following condition is met, a hierarchical address search is guaranteed always to resolve to the longest match entry in one CAM search cycle:

For all CAM 20 entries n: mask(n)≧mask(n+1)

As will be discussed in detail below, the PO of the present invention ensures that the CAM 20 entries are sorted properly so that searches always find the longest matching entry (i.e., the entry with the most number of "1"s in its mask). By ensuring that the CAM 20 entries are always ordered, the longest matching address is always found within a single compare operation.

Figure 26:
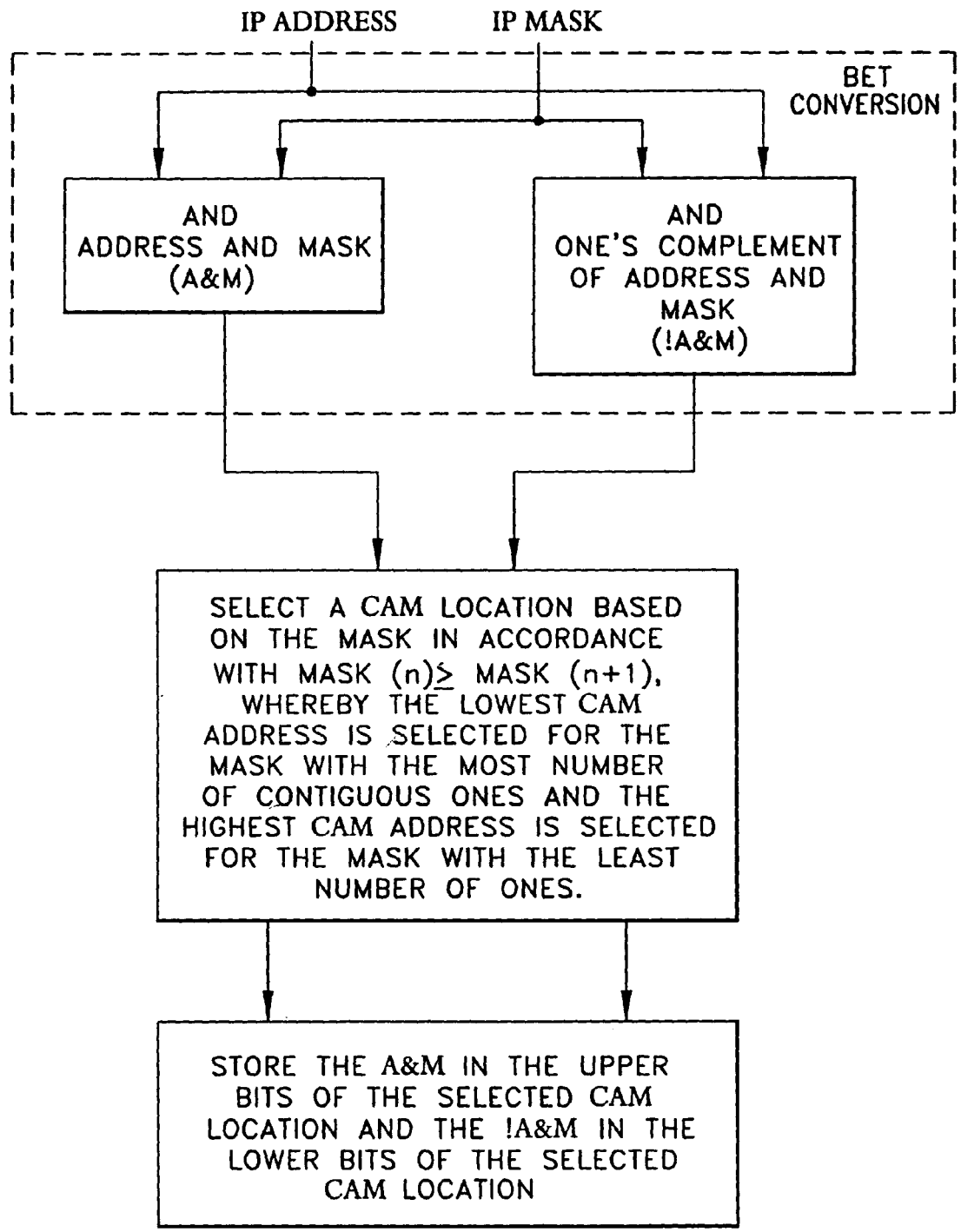
FIG. 26 is a flowchart for the method of the present invention for storing the binary-encoded ternary addresses in a binary CAM.
Figure 27:
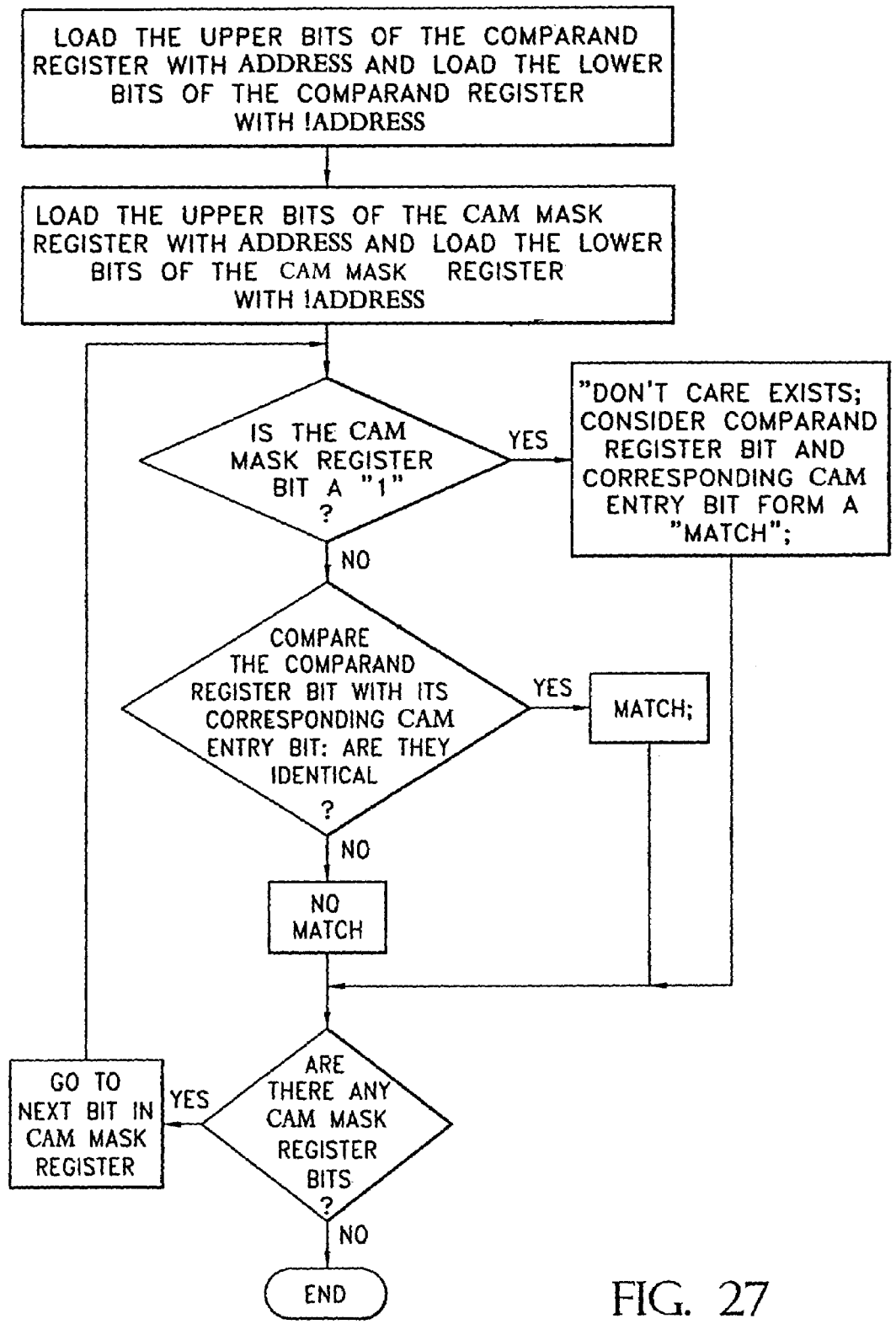
FIG. 27 is a flowchart of a binary CAM operation during a search routine.

To implement the PO and BLS of the present invention using a binary CAM, for example, it is necessary to discuss how the BET (binary-encoded ternary) values are stored in the binary CAM 20 (FIGS. 18–26). Next, a flowchart describing the CAM 20 operation during a search is shown in FIG. 27. Then the BES method 220 (FIG. 12) is explained using FIGS. (28–35).

BET Conversion/Storage in a Binary CAM (BETAS)

To facilitate IPv4 CIDR, a CAM 20 is split into separate groups or blocks demarcated by IP mask values (FIG. 9). If a group of addresses that share the same mask are to be stored, there must be some way of encoding the "don't care" condition indicated by the address mask. Therefore, as discussed previously, two binary CAM bits are required to encode a single ternary (1, 0, X) entry. To binary encode the ternary values (1, 0, X), 64 bits are required to store a 32-bit value.

The basic principle is that the binary value and its complement are stored if 1 or 0 is required, but when the "don't care" condition is needed, 0 and 0 is stored. FIG. 19 shows how the three ternary values are encoded.

The actual BET conversion can be accomplished for the binary CAM 20 either in external circuitry (FIG. 15, e.g., a separate IC 34A that is located external of the CAM 20 or forms a portion 34B of the forwarding hardware 26) or in internal CAM 20 circuitry 36 (FIG. 16) to achieve the result of making a binary CAM appear as a ternary CAM to the system, whereby an N-bit binary CAM word acts a N/2-bit ternary CAM word. The advantage of using external circuitry 34A or 34B, is that it can enhance system performance and increase maintainability. Alternatively, the advantage of using internal CAM circuitry 36 (e.g., Music Semiconductors, Inc., assignee of the present invention, markets a CAM device with a built-in binary to ternary converter, part no. MUAC4K64, all of whose product literature is incorporated by reference herein) is that doing so reduces the required input/output bandwidth by a factor of two. FIG. 17 depicts the situation where a ternary CAM is used and the ternary addresses are passed directly to the ternary CAM.

As an example of the BETAS of the present invention, the BETAS is used to store 32-bit ternary values as 64-bit binary encoded ternary values in a 64-bit wide CAM. The high order bit of each 2-bit ternary value is stored in the upper 32 bits of the CAM entry while the low order bit is stored in the lower 32 bits of the CAM entry. For example, as shown in FIG. 22, to store C0.18.0C.15, bits 63:60 ($C_{hex}$) of the CAM entry would be 1100 and bits 31:28 would be 0011 ($3_{hex}$). This is equivalent to the ternary value 1100 as the binary encoded equivalent 10 10 01 01. As can be seen most clearly from FIG. 23, the lower 32 bits are simply the 1's complement of the upper 32 bits. This unique storage mechanism (BETAS) stores binary complementary values n bits apart, i.e., the binary pair values at binary bit n and n+32, thereby making the BET conversion easy to compute using a general purpose processor.

To form the groups of addresses with the same IP masks, the individual addresses have their masks added to them as they are inserted into the CAM 20 memory array. To store an IP address and IP mask in a 64-bit wide CAM 20 location, the bit-wise logical AND of the IP address and IP mask are stored in the upper 32 bits while the bit-wise logical AND of the mask and the address's 1's complement are stored in the lower 32 bits. FIG. 18 shows how the IP address C0.18.0C.15 and the IP mask FF.FF.FF.FF would be stored in a CAM memory location according to the BETAS of the present application. FIG. 26 is a flowchart of how the address/mask are stored in the CAM 20 in accordance with the present invention.

Search of the CAM 20

The search method (FIG. 27) of the present invention also utilizes the BET scheme when searching the binary CAM 20 for a ternary value. It is necessary incorporate a CAM mask register when the compare is performed. To search the CAM memory array for the ternary value 1, a "10" is loaded into both a Comparand register 38 and a Mask register 40 (FIG. 20), which are both located in the CAM 20. The search would yield the results shown in FIG. 20. The ternary equivalent of each value is shown in parentheses after the binary-encoded value. The search resulted in the CAM entries 00 (X) and 10 (1) matching the Comparand register 38 contents 10 (1). The contents of the Comparand register 38 is effectively seen as X0 during the compare because the Mask register 40 is also loaded with 10. This makes the first bit of the binary encoded value a "don't care" and will therefore match with either 1 or 0. Similarly a search for 01 (0) would produce a match with the CAM entries 01 (0) and 00 (X). This effectively gives a match result when there is a ternary X value, which is what is expected.

When the Mask register 40 is used to mask out bits during the compare, it effectively allows ternary "don't cares" to be incorporated during a search. The Mask register 40 works in the opposite way from an IP mask. When the Mask register bit is set to 1, the result will always be a match condition. FIG. 21 shows the Truth Table of CAM compares using the Mask register 40.

There is enough information in each entry to determine the explicit mask/address pair that generated it. For example, to search for the entry C0.18.0C.15, a compare would be performed using C0.18.0C.15 as the upper 32 bits and its 1's complement, 3F.E7.F3.EA, as the lower 32 bits. The Mask register 40 also is loaded with the same value and is used when the compare takes place. The CAM Mask register 40 is used to determine which bits take part in the search and which bits are effectively ignored. As was seen in FIG. 20, the CAM mask works in the opposite way from an IP mask. This means that 1 corresponds to a "don't care" while a 0 corresponds to a "care" bit.

Each address is logical ANDed with the appropriate mask value before being stored as binary encoded ternary. To perform a search operation using this searching method, the address being searched for is copied to the upper 32 bits of both the Comparand register 38 and the Mask register 40 and the 1's complement of the address is copied to the lower 32 bits. This again is loading the binary encoded ternary equivalent. FIG. 24 shows how four 32-bit ternary values and their IP masks would be encoded and stored in a 64-bit CAM.

Because of the ability to binary encode the ternary value X ("don't care"), the IP address and IP mask can be combined and stored as 64 bits. These 64-bit values are stored in the binary CAM 20 memory array in IP mask order. That means, the IP mask values that have the higher number of contiguous 1s are stored in the higher priority locations. How the CIDR entries are sorted into blocks, will be discussed later.

If IP address C0.18.0C.15 were encoded in the normal manner and compared with the four entries in FIG. 24, each entry would produce a match result. If the entries were sorted properly, the highest priority match would be entry number 1 (since that IP address has the highest number of contiguous 1s in its IP mask and was stored in the CAM in the higher priority location), which would be the desired result. FIG. 25 shows the results of the comparison between C0.18.0C.15 and entry number 3, i.e., C0.18.0C.00. This shows how the combination of the binary encoded ternary values and the use of the Mask register 40 work to produce a match result.

An exemplary CAM 20 is the MUSIC Semiconductors WidePort LANCAM (all of whose product literature is incorporated by reference herein) which has a 32-bit I/O bus. This allows the 64-bit binary encoded ternary values to be loaded into the Mask register 40 in two cycles. The search procedure consists of the following:

1. Two Short cycles—Load IP Address to bits [63:32] of Mask register and load NOT (IP Address) to bits [31:0] OF Mask register.
2. One Short cycle—Copy the Mask register to the Comparand register.
3. One Long cycle—Initiate a comparison with the CAM memory array through the Mask register.
4. One Medium cycle—Read out the CAM array address of highest-priority match. This address would be used as an index to access associated data stored in external RAM.

Using these five cycles, the search time required is as follows:

50 ns speed grade CAM: 210 ns with a 15 ns clock, or 4.76 million searches per second.
70 ns speed grade CAM: 280 ns with a 20 ns clock, or 3.57 million searches pre second.

Block-Edge Sorting Method

In FIG. 12, there is shown a flowchart for optimally implementing a partially-ordered CAM 20, which has been referred to as "block-edge sorting (BES)". Thus, the goal of partial ordering is to maintain a sorted CAM 20 to enable longest matches in one search cycle. Although applicability of BES is being described for use with a binary CAM, BES can also be used with ternary CAMs.

As stated previously, in order to obtain the longest match using either a binary CAM 20 or a ternary CAM, it is necessary to maintain the CAM 20 so that the ternary addresses with the larger mask numbers are stored in the higher priority addresses of the CAM 20. This condition can be summarized by the statement:

For any entry at address n, mask(n)≧mask (n+1)

As long as this condition is true for all addresses, the longest match is assured in one search cycle for lowest-address priority CAM's 20. FIG. 10 shows a properly sorted CAM 20 that conforms to the condition mask(n)≧mask(n+1). The letter in the notation "letter/number" can be interpreted as the address while the number corresponds to the hierarchical mask level. For instance, "A/32" matches "A/30" up to the 30$^{th}$ bit and is more of an exact match. A search for hierarchical address "A" would match "A/32" first. In contrast, FIG. 11 shows CAM with the condition mask(n)≧mask(n+1) violated. A search for "A" would get "A/30" instead of "A/32", which is not the longest match and is incorrect.

The difficult task is to ensure this condition always exists as addresses are added to and deleted from the CAM 20. The simple approach is to empty the CAM 20 every time it has to be updated and then reinsert every entry. This can be a time-consuming process especially if the routing tables are not static and subject to dynamic changes. The time to empty and refill the routing tables in the CAM 20 using this method could significantly decrease system performance and bandwidth.

A unique solution to this problem is to use a block-edge sorting algorithm (FIG. 12) that enables real-time modification of the CAM 20 routing table while reducing the time the CAM 20 cannot be searched to exceptionally low levels.

The block-edge sorting method takes a CAM 12 (or array of CAM'S) and segments the memory space in blocks. The block characteristics can be represented in software or hardware as pointers and flags. Each block corresponds to one and only one hierarchical mask. For example, IPv4 has at most 32 unique masks which would be represented by 32 CAM blocks. Hierarchical addresses are stored in their corresponding mask block. The order of the entries within each block is unimportant and is not kept track of because it is possible to get no more than one unique match from each block. If more than one match does occur from a block, it can only mean that there are multiple identical hierarchical address entries in that block. The block-edge sorting method avoids the need to empty and refill the CAM every time a new entry appears by reducing the worst case to shuffling entries at the edges of each block. This method can be performed either in an iterative or recursive manner.

The block characteristics consist of the:

Floor(f/): starting address index (known hereinafter as the "floor pointer"), which indicates the first address in the block;

Nxtfree (n/): the next free entry address index (known hereinafter as the "next-free pointer"), which indicates the next address to place an entry;

Blocksize: the block size of remaining entries; and

Backpressure flag: a flag or flags indicating the status of the fullness of the adjacent blocks in the hierarchy (known hereinafter as the "back-pressure" flags), which indicates that this and all other blocks "below" are filled.

The floor keeps track of the lowest address entry in the hierarchical block. The next-free pointer indicates the next destination address for new address entries. The block size value in conjunction with the next-free pointer and the floor-pointer keeps track of whether or not the block is full. Alternatively, a remaining entries counter represents the same information.

The first case for inserting a new hierarchical address entry is when the destination block has at least one free entry left. In this case, the new address is inserted at the location indicated by the next-free pointer for the block. This case is shown in FIG. 28, where the new address is inserted and the next-free pointer is incremented to properly indicate the next position for inserting entries.

If the sizes of each hierarchical block are carefully chosen so as to accurately represent the mask content of the routing tables being stored, the majority if not all of the address inserts will be of the simple default type described in FIG. 28. However, the block-edge sorting method expects this not to be the case and reacts accordingly to the cases where a new address entry is being inserted into a block that does not have any free entries left.

The next case, illustrated in FIGS. 29a–29c, concerns when the destination block is full. When the destination block is full, space must be allocated above or below the block to accommodate the new entry. In this example, of the block-sorting method and all following illustrations, the block-edge sorting method prefers to steal space from the lowest hierarchical mask block adjacent to the one in question. However, the method applies in either initially stealing in the upwards or downwards direction and loses no generality when illustrated in the downwards direction. An optimal implementation might choose to sort in the direction of the nearest free space, either above or below the full block in question. The downwards direction is selected only to be aesthetically consistent with the notion that higher mask priorities have precedence over lower mask priorities and the probability that there will be more entries with higher mask priorities.

In FIG. 29a, a new entry is shown with hierarchical mask level 32 being inserted into block 32, which is represented by the floor-pointer "f/32" and the next-free pointer "n/32", and the block size equal to three, which can be inferred from the diagram by the block spacing. Block 32 is full, so the sorting algorithm looks at block 31, the adjacent block with lower mask priority. Block 31 is not full and the back-pressure flag is not set, therefore, there is a space in block 31 to steal to accommodate block 32. FIG. 29b shows the floor entry A/31 being moved to the next-free location in block 31. After A/31 is moved, so the new entry is moved to occupy the newly-freed location. The pointers and block-sizes are adjusted to properly reflect the changes. In this case, block 32's size increases to 4 while block 31's size decreased to 3. Note that A/31 is now after B/31 which has no effect whatsoever upon the proper sorting in the CAM 20 because the internal ordering of blocks is irrelevant as long as the entries in the block have the same hierarchical mask numbers.

Figures 30A, 30B, 30C:
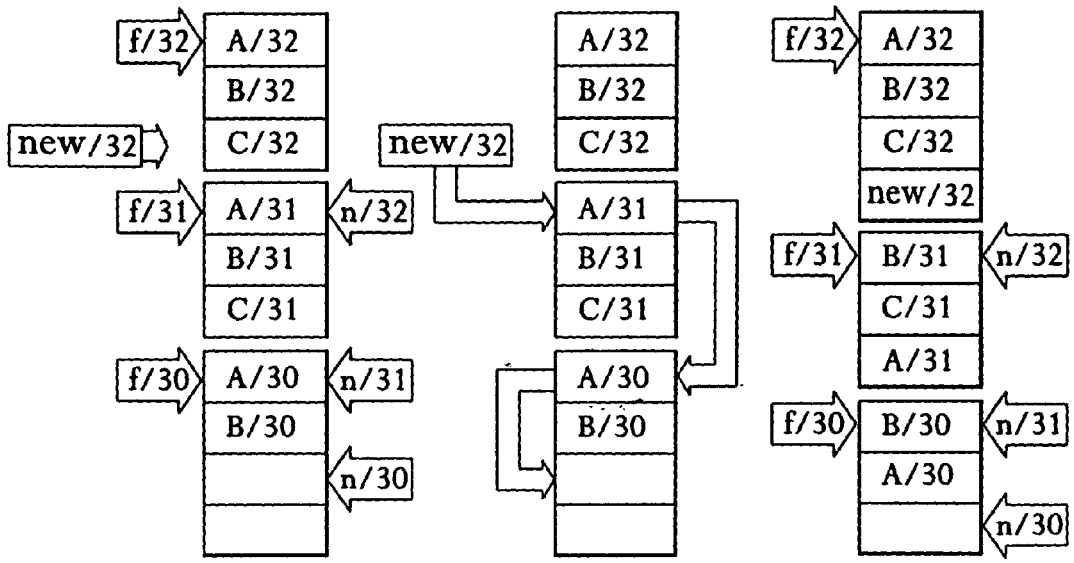
FIGS. 30a–30c together depict the method for insertion of a new hierarchical address entry using two sorts.
Figures 31A, 31B, 31C:
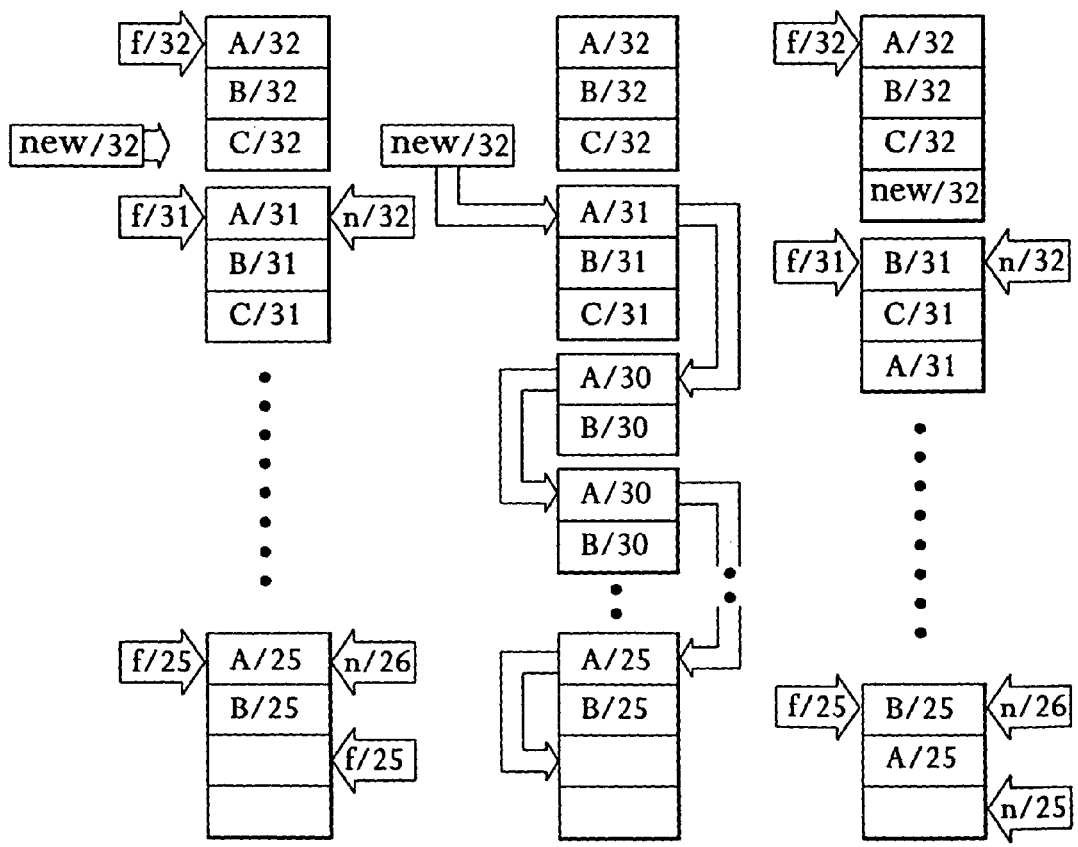
FIGS. 31a–31c together depict the method for insertion of a new hierarchical address entry recursive downward sorting.

FIGS. 30a–30c and FIGS. 31a–31c show how the insertion method extends to multiple blocks. In FIGS. 30a–30c, the new entry is destined for block 32, which is full. There is at least one space somewhere between that block and the highest memory address because no back-pressure flags are set. Due to this fact, the robbing will ripple downwards until it terminates successfully upon the first free entry. The moves are executed "backwards" from the terminating block to the insertion of the new entry. This has to be done in order to prevent entries from being overwritten before they are copied to their new location. In the case for FIGS. 30a–30c, A/30 is moved to n/30, then A/31 is moved to f/30, then new/32 is moved to f/31. FIGS. 31a–31c show that this sorting can scale to any number of blocks. The first free entry below block 32 is in block 25. In this case, the terminating move is the move of A/254 from f/25 to n/25. Block 32's steal carries all the way down to block 25, effectively stealing space from it as the only changes in block-sizes are in block 32 and block 25 where block 32 increases to 4 and block 25 decreases to 3.

Figures 32A, 32B, 32C:
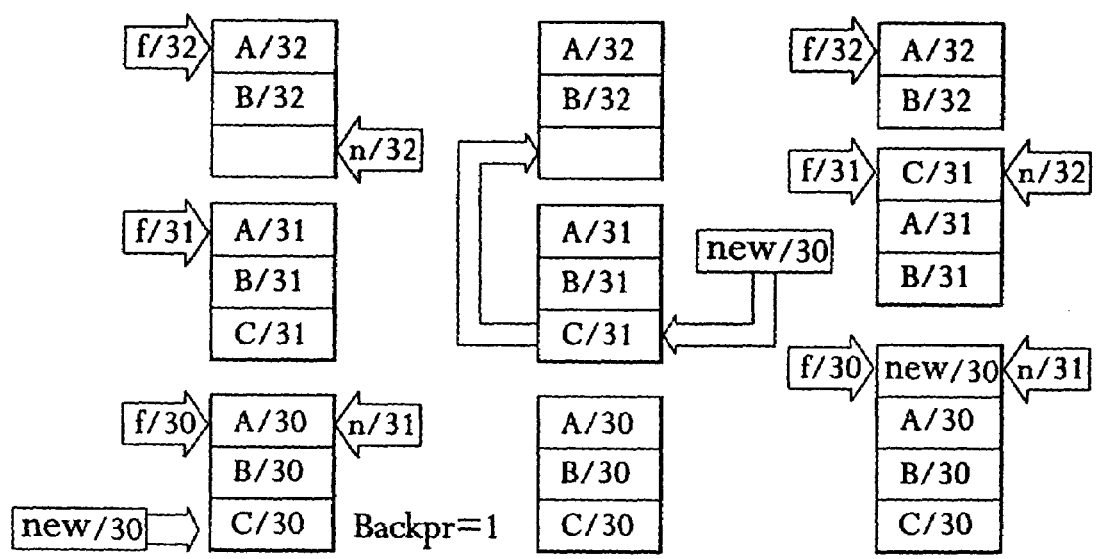
FIGS. 32a–32c together depict the method for upward insertion of a new hierarchical address entry.

A special case to consider is when an entry is to be added to a full block and the blocks below are also full. When this occurs, entries cannot be swept further "downwards" to produce an empty location in the required block. Instead, they must be pushed up if there is any free space above. See FIGS. 32a–32c.

Figures 33A, 33B, 33C:
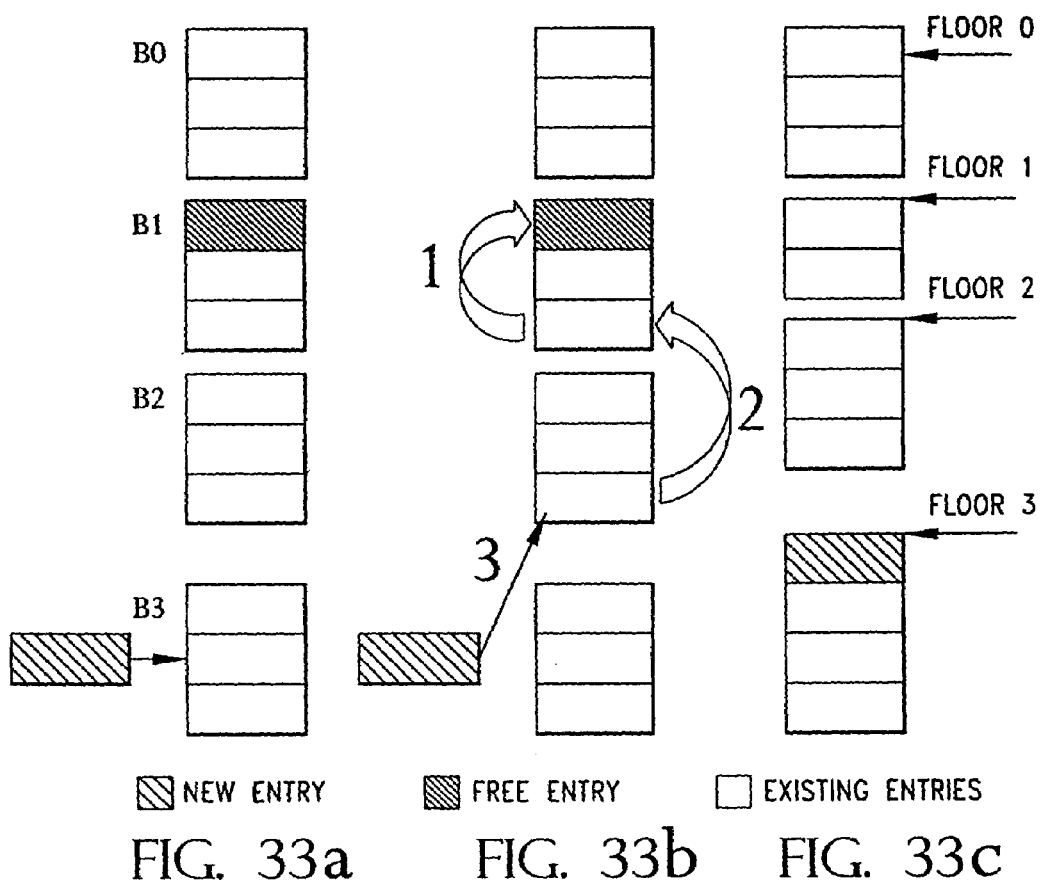
FIGS. 33a–33c together depict the method for upward insertion of a new hierarchical address entry using recursive upward sorting.

A "Backpressure" flag, mentioned earlier, is set in the last block when there is no more space available. The meaning of the "backpressure flag" is this: if it is not set, there is at least one more free entry somewhere between the current block and the highest physical memory location. If it is set, then all blocks below the current block are full. Blocks attempting to push downward check this flag and, if it is set, are forced to try to push entries upward. In this case, recursion downward into the blocks would not work because there is no more free memory. Instead, recursion must go upwards. The same sorting routine is applied here with the difference being that the sorting goes in the opposite direction. FIGS. 33a–33c show an example of recursive sorting upwards.

In FIG. 33a, a new entry is destined for the last block but it is full, requiring the edge sorting to go upward instead of downward. Secondly, FIG. 33b shows the moves and inserts that will be done to free an entry space in the final block. As before, the Routing database sorted in the CAM will always yield a correct search result due to the order of the moves and inserts. Finally, FIG. 33c shows the blocks as represented by their readjusted pointers and block size values.

Figures 34A, 34B:
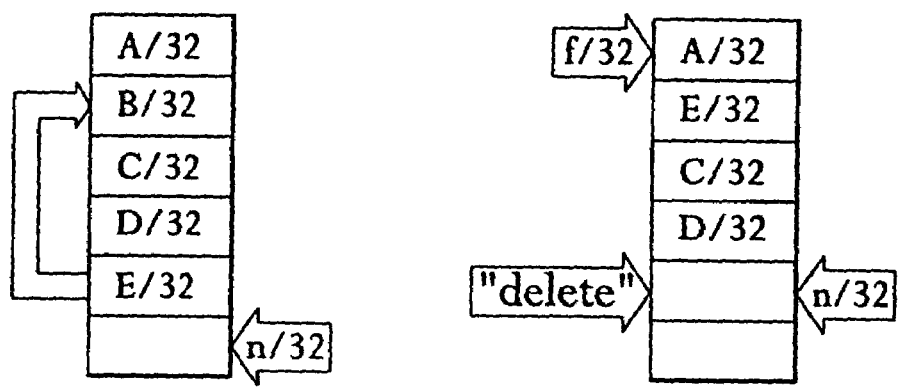
FIGS. 34a–34b together depict the method for deleting any entry.

In order to delete entries from the CAM routing table and reuse the freed addresses, it is necessary to move the last entry in the block to the address being deleted. FIGS. 34a–34b shows the entry B/32 being removed form the routing table. First, E/32 is copied to B/32's address, overwriting and effectively deleting B/32. Then the entry E/32 at the original location is deleted and the next-free pointer is decremented to properly reflect the new spaces.

Depending upon how the routing table updates are performed, it may be necessary to search for explicit IP address/mask combinations to determine if an entry is already in the CAM 20. In this case, the longest match is not what is being looked for. Therefore, the search procedure is slightly different from the one used to locate the longest match. When searching for the longest match, the Comparand register 38 contents are duplicated in a Mask register 40 and the search is performed with the relevant bits masked out.

When searching for explicit entries there is no need to use the Mask register 40. The (ADDR & MASK), (!ADDR & MASK) representation of the IP address/mask pair is loaded into the Comparand register 38 and a compare is initiated. The address/mask pair is compared with the entries in the CAM 20 memory array. This search will only yield a match if the CAM 20 entry exactly matches the entry in the Comparand register 38. The LANCAM family has foreground and background register sets, which can make this task easier.

The foreground registers should be set to do loading and searches for the longest matches as described earlier while the background registers should be set to perform explicit CAM searches that would perform compares without using a Mask register 40. It is then only necessary to switch between the two register sets as needed.

Figure 35:
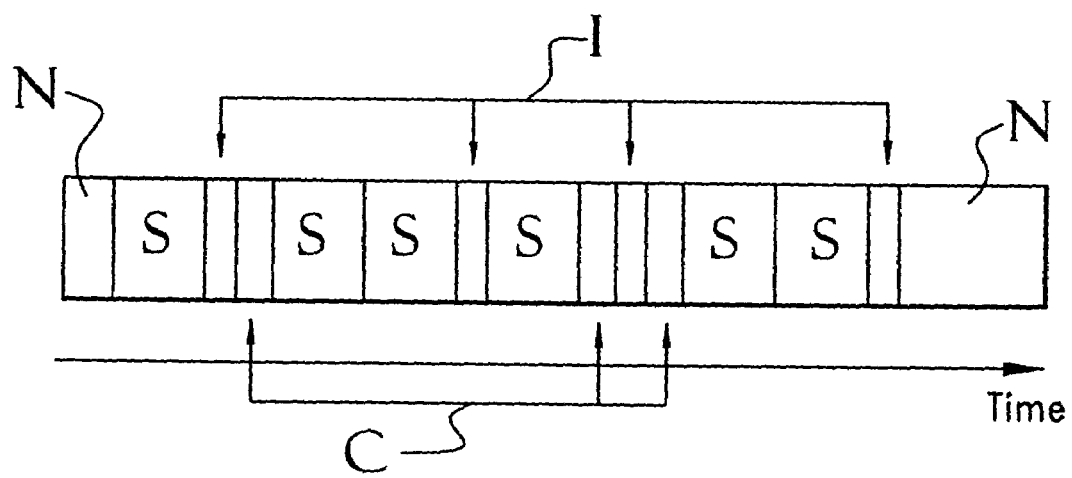
FIG. 35 depicts an interleaving cycle for recursive sorting.

It is possible to interleave operations of the CAM 20 in order to keep the table updated while continuing to perform high bandwidth searches. For searches, the atomic operation is the five instruction load/load/copy/search/read index sequence. The insertion operation can be broken up into different atomic operations that can be interleaved in between gaps in the atomic search operations. The following enumerate the different atomic insert operations:

1. Insert to address:
    Two short cycles: load (ADDR & MASK) and (!ADDR & MASK)
    One short cycle: insert to address
2. Read out entry to be copied/moved FIG. 35 shows how the four inserts (I) and three copies (C) required in the previous example on recursive sorting could be queued and interleaved in between address searches (S). No operation is indicated by (N). The worst case number of cycles for this can be calculated assuming that the new entry is inserted to the first block but all blocks except the last are full. For k partitions there are:

k-1 CAM read cycles
k-CAM write cycles
k-RAM read/write cycles

An important point to note is that since k entries are moved, the overhead of moving their associated data in RAM must also be considered. However, this worst case only happens once; with thoughtful initial block allocation, inserting a new entry into the CAM will take one write cycle. A good precautionary measure to avoid long sorting operations is to adjust the block size and the spacing during idle periods to avoid shuffling during busy periods.

If the associated data entries stored in RAM are more than a few bytes in length, a scheme using a second section of RAM to incorporate pointers might be considered The pointers would point to the associated data entries of each CAM 20 entry, which would avoid moving large blocks of data. When the associated data entries are shuffled, it is a simple case of rearranging the pointers. This would remove the need to move the associated data around, which will reduce the associated data maintenance time.

The methods described in present application are flexible enough to be used with different styles of updating the routing tables and therefore allows a system designer or software engineer the ability to use the most suitable method available. Using the algorithms described in the present application in conjunction with dynamic routing table updates would be more efficient than reloading the routing table in the CAM and refilling it. This is because search operations could still be performed during the updates.

Without further elaboration, the foregoing will so fully illustrate our invention that others may, by applying current or future knowledge, readily adopt the same for use under various conditions of service.

We claim:

1. A binary content addressable memory (CAM) for storing ternary hierarchical addresses of a communication system therein and wherein each ternary hierarchical address comprises a communication system address and associated communication system address mask, said binary CAM comprising a plurality of entries wherein:
    each entry comprises:
        (1) a first value comprising the logically ANDed communication system address and its associated mask; and
        (2) a second value comprising the logically ANDed complement of said communication system address and its associated mask; and
    wherein each entry is positioned in said CAM based on the number of contiguous ones in said associated mask.

2. The binary CAM of claim 1 wherein entries having the most amount of contiguous ones in said associated mask are located at the top of said CAM and wherein entries having the least amount of contiguous ones in said associated mask are located at the bottom of said CAM.

3. The binary CAM of claim 2 wherein said first value comprises n bits and said second value comprises n bits and wherein each one of said bits in said first value has an associated bit in said second value, said each one of said bits and said associated bit forming a binary pair, said binary pair representing one bit of said address as two bits in said CAM.

4. The binary CAM of claim 3 wherein a 1 in said ternary hierarchical address is represented as 10 in said CAM, wherein a 0 in said ternary hierarchical address is represented as 01 in said CAM, and wherein a don't care in said ternary hierarchical address is represented as 00 in said CAM.

5. The binary CAM of claim 3 wherein said first value is stored in an upper portion of said entry and said second value is stored in a lower portion of said entry.

6. The binary CAM of claim 5 wherein said entry comprises 64 bits and wherein n is 32.

7. A binary content addressable memory (CAM) for storing ternary hierarchical addresses of a communication system therein and wherein each ternary hierarchical address comprises a communication system address and associated communication system address mask, said binary CAM comprising a plurality of entries wherein:
    each entry comprises a two bit representation for each bit in said ternary hierarchical address; and
    wherein each entry is positioned in said CAM based on the number of contiguous ones in said associated mask.

8. The binary CAM of claim 7 wherein:
    (a) a 1 in said ternary hierarchical address is represented by said two bit representation in said CAM as 10;
    (b) a 0 in said ternary hierarchical address is represented by said two bit representation in said CAM as 01; and
    (c) a don't care in said ternary hierarchical address in represented by said two bit representation in said CAM as 00.

9. The binary CAM of claim 8 wherein entries having the most amount of contiguous ones in said associated mask are located at the top of said CAM and wherein entries having the least amount of contiguous ones in said associated mask are located at the bottom of said CAM.

10. A method for storing ternary hierarchical addresses of a communication system in a binary CAM wherein each ternary hierarchical address comprises a communication system address and associated communication system address mask, said method comprising the steps of:
    logically ANDing each communication system address and its associated mask to form a first value;
    logically ANDing the complement of each communication system address and its associated address mask to form a second value; and
    storing said first value and said second value in an entry in said binary CAM based on the number of contiguous ones in said address mask.

11. The method of claim 10 wherein said step of storing said first value and said second value at a location comprises arranging entries such that entries having the most contiguous ones in said associated mask are located at the top of said CAM and wherein entries having the least amount of contiguous ones in said associated mask are located at the bottom of said CAM.

12. The method of claim 11 wherein said first value comprises n bits and said second value comprises n bits and wherein said step of storing said first value and said second value comprises associating each one of said bits in said first value with one bit in said second value to form a binary pair, said binary pair representing one bit of said address as two bits in said CAM.

13. The method of claim 12 wherein said step of representing one bit of said ternary hierarchical address as two bits in said CAM comprises:
    (a) utilizing 10 in said CAM to represent a 1 in said ternary hierarchical address;
    (b) utilizing 01 in said CAM to represent a 0 in said ternary hierarchical address; and
    (c) utilizing 00 in said CAM to represent a don't care in said ternary hierarchical address.

14. The method of claim 12 wherein said step of storing said first value and said second value comprises storing said first value in an upper portion of said entry and storing said second value in a lower portion of said entry.

15. The method of claim 14 wherein said entry comprises 64 bits and wherein said step of storing said first value and said second value comprises storing said first value in the upper 32 bits and storing said second value in the lower 32 bits.

16. A method of storing for storing ternary hierarchical addresses of a communication system in a binary CAM wherein each ternary hierarchical address comprises a communication system address and associated communication system address mask, said method comprising the steps of:
    (a) generating a CAM entry for each ternary hierarchical address by:
        (1) identifying that portion of each ternary hierarchical address that are don't cares;
        (2) representing each bit in said ternary hierarchical address using bits in said CAM wherein:
            (i) a 1 in said ternary hierarchical address is represented as 10 in said CAM;
            (ii) a 0 in said ternary hierarchical address is represented as 01 in said CAM; and
            (iii) a don't care in said ternary hierarchical address is represented as 00 in said CAM;
    (b) positioning each CAM entry in said CAM based on the number of contiguous ones in said associated mask.

17. The method of claim 16 wherein said step of positioning each CAM entry in said CAM comprises arranging entries such that entries having the most contiguous ones in said associated mask are located at the top of said CAM and wherein entries having the least amount of contiguous ones in said associated mask are located at the bottom of said CAM.

18. A method of searching a binary CAM to find a match for a ternary hierarchical address of a communication system, said binary CAM comprising entries of ternary hierarchical addresses, each ternary hierarchical address entry comprising a communication system address and an associated communication system address mask, said entries of ternary hierarchical addresses being stored in said binary CAM as a first value and a second value, said first value comprising the communication system address logically ANDed with said address mask and said second value comprising the complement of said communication system address logically ANDed with said address mask, and wherein all of said entries are ordered in said binary CAM based on the number of contiguous ones in said mask, said method comprising the steps of:
    (a) loading a first register with the communication system address to be searched along with the complement of the communication system address;

(b) loading a second register with the communication system address to be searched along with the complement of the communication system address;

(c) associating each bit of said first register with one bit of said second register and with one bit of each entry in said binary CAM;

(d) determining whether a bit match occurs between corresponding bits of said first register and each entry in said binary CAM as qualified by said corresponding bit of said second register; and (e) obtaining a match between the desired ternary hierarchical address and one of said entries based on the greatest number of matches of corresponding bits of said first register and each entry in said binary CAM.

19. The method of claim 18 wherein said step of determining whether a bit match occurs between corresponding bits of said first register and each entry in said binary CAM as qualified by said corresponding bit of said second register comprises declaring a bit match between corresponding bits of said first register and each entry in said binary CAM:

(1) if the corresponding bit in said second register is a 1; or (2) if the corresponding bit in said second register is a 0 and the corresponding bits of said first register and each entry in said binary CAM are identical.

20. The method of claim 19 wherein said steps of loading a first and second register comprises loading the communication system address to be searched in an upper portion of said registers and loading said complement of the communication system address in a lower portion of said registers.

21. The method of claim 20 wherein said first and second registers comprise 64 bits and wherein said steps of loading said first and second registers comprises loading the communication system address to be searched in the upper 32 bits of said registers and loading said complement of the communication system address in said lower 32 bits of said registers.

22. A method of searching a binary CAM to find a match for a ternary hierarchical address of a communication system, said binary CAM comprising entries of ternary hierarchical addresses, each ternary hierarchical address comprising a communication system address and an associated communication system address mask, each ternary hierarchical address entry being stored in said binary CAM whereby 10 is stored in said entry for every 1 in said ternary hierarchical address, 01 is stored in said entry for every 0 in said ternary hierarchical address, and 00 is stored in said entry for every don't care in said ternary hierarchical address, and wherein all of said entries are ordered in said binary CAM based on the number of contiguous ones in said mask, said method comprising the steps of:

(a) loading a first register and second register with the communication system address to be searched by:

(1) loading a 10 in said first and second registers for every 1 in the ternary hierarchical address to be searched;

(2) loading a 01 in said first and second registers for every 0 in the ternary hierarchical address to be searched;

(3) loading a 00 in said first and second registers for every don't care in the ternary hierarchical address to be searched;

(b) associating each bit of said first register with one bit of said second register and with one bit of each entry in said binary CAM;

(c) declaring a bit match between corresponding bits of said first register and each entry in said binary CAM:

(1) if the corresponding bit in said second register is a 1; or (2) if the corresponding bit in said second register is a 0 and the corresponding bits of said first register and each entry in said binary CAM are identical; and (d) obtaining a match between the desired ternary hierarchical address and one of said entries based on the greatest number of matches of corresponding bits of said first register and each entry in said binary CAM.

23. A method for maintaining a sorted CAM to enable longest matches in a single search cycle when hierarchical addresses are added to, or deleted from, the CAM in a communication system utilizing hierarchical addresses and associated address masks, said method comprising the steps of:

(a) segmenting the CAM into blocks wherein each block corresponds to a single hierarchical mask and wherein said blocks are arranged in the CAM such that the lowest CAM addresses contain the highest hierarchical masks and the highest CAM addresses contain the lowest hierarchical masks;

(b) storing hierarchical addresses according to said block having a corresponding hierarchical mask; and (c) tracking the first address and the next free address of each of said blocks and the size of each of said blocks.

24. A content addressable memory (CAM) of a communications system utilizing ternary hierarchical addressing and associated address masks, said CAM comprising:

a plurality of address entries and associated address masks that are arranged in said CAM by mask number, with address entries having the highest mask number being located at address entry locations at the top of the CAM and address entries having the lowest mask number being located at address entry locations at the bottom of the CAM, said mask number being defined as the number of contiguous ones in an associated address mask.

25. An apparatus for storing a plurality of address entries and associated address masks in a communication system utilizing ternary hierarchical addressing and associated address masks, said apparatus comprising:

a binary CAM;

a binary-encoded ternary converter coupled to said binary CAM wherein said binary-encoded ternary converter converts each ternary value into a corresponding binary-encoded ternary value to form said address entries; and wherein said plurality of address entries and associated address masks are arranged in said binary CAM in a plurality of address entry groups, each address entry group having a respective mask number, with said address entry group having the highest mask number being located at the highest location of the CAM and said address entry group having the lowest mask number being located at the lowest location of the CAM, said mask number being defined as the number of contiguous ones in an associated address mask.

26. A method for accelerating the routing of hierarchical addressing in a communication system which utilizes ternary hierarchical addressing and associated address masks, said method comprising the steps of:
(a) obtaining communication system hierarchical addresses and associated masks to form a plurality of address entries; and
(b) storing said plurality of address entries in a content-addressable memory (CAM) device by mask number wherein said mask number is defined as the number of contiguous ones in an associated address mask and wherein address entries having the highest mask number are stored in address entry locations at the highest location of the CAM and address entries having the lowest mask number are stored at address entry locations at the lowest location of the CAM.

27. A content addressable memory (CAM) of a communication system as defined in claim 24 wherein said plurality of address entries comprises:
a first group of address entries sharing a first said address mask and a second group of address entries sharing a second said address mask, said first and second groups being located at different locations of the CAM.

28. A content addressable memory (CAM) of a communication system as defined in claim 27 further comprising at least one vacant address entry location disposed within said CAM between said first and second groups of address entries.

29. An apparatus for storing a plurality of address entries and associated address masks in a communication system as defined in claim 25 further comprising:
at least one vacant address entry location within said CAM adjacent at least one of said address entry groups.

30. A method for accelerating the routing of hierarchical addressing in a communication system as defined in claim 26 further comprising the steps of:
receiving an address value in a comparand register of said CAM;
matching a further plurality of addresses, including a subset of said communication system hierarchical addresses, to said address value; and
outputting an ouyut hierarchical address of said further plurality of addresses according to respective storage locations of said further plurality of addresses.

31. A method for accelerating the routing of hierarchical addressing in a communication system as defined in claim 30 wherein said output hierarchical address of said further plurality has a storage location lowest among said respective storage locations of said further plurality of addresses.

32. A method for accelerating the routing of hierarchical addressing in a communication system as defined in claim 30 wherein said further plurality of said communication system hierarchical addresses each includes at least one identical bit.

* * * * *

UNITED STATES PATENT AND TRADEMARK OFFICE
CERTIFICATE OF CORRECTION

PATENT NO. : 7,139,867 B2
APPLICATION NO. : 10/645604
DATED : November 21, 2006
INVENTOR(S) : David C. Feldmeier et al.

It is certified that error appears in the above-identified patent and that said Letters Patent is hereby corrected as shown below:

In the Specification, the following errors are corrected:

Column 3, line 8, "to the user know that" should read --so the user knows that--;

Column 5, line 15, "The" should read --the--;

Column 7, line 57, "It still" should read --It is still--; and

Column 10, line 34, "10 FIG. 22" should read --FIG. 22--.

FIG. 22 should be indented as a new paragraph in the next line.

In Claim 8, the following error is corrected:

Column 19, line 35, "address in" should read --address is--.

Signed and Sealed this

Sixth Day of March, 2007

JON W. DUDAS
*Director of the United States Patent and Trademark Office*